United States Patent

Sasaki

[11] Patent Number: 6,144,324
[45] Date of Patent: Nov. 7, 2000

[54] METHOD OF MODULATING AND DEMODULATING DIGITAL DATA AND DIGITAL DATA MODULATOR/DEMODULATOR

[75] Inventor: Hiroshi Sasaki, Hachioji, Japan

[73] Assignee: Olympus Optical Co., Ltd., Tokyo, Japan

[21] Appl. No.: 09/034,899

[22] Filed: Mar. 4, 1998

[30] Foreign Application Priority Data

Mar. 13, 1997 [JP] Japan .................................. 9-059321

[51] Int. Cl.$^7$ ................................................. H03M 13/00
[52] U.S. Cl. ............................................................. 341/94
[58] Field of Search ................... 341/59, 94, 87, 341/55

[56] References Cited

U.S. PATENT DOCUMENTS 5,257,270  10/1993  Hilden et al. .
5,406,569  4/1995  Isozaki .

FOREIGN PATENT DOCUMENTS 0 670 555 A1  9/1995  European Pat. Off. .
0 713 194 A1  5/1996  European Pat. Off. .
0 717 398 A2  6/1996  European Pat. Off. .
0 765 041 A2  3/1997  European Pat. Off. .
52-11916      1/1977  Japan .
60-12840      1/1985  Japan .

OTHER PUBLICATIONS

K.A. Immink: Code Configuration for Avoiding Error Propagation Electronics Letters, vol. 32, No. 24, Nov. 21, 1996, Stevenage, Herts, G.B., pp. 2191–2192.

O. Ytrehus: "Runlength Limited Codes for Mixed Error Channels" IEEE Transactions on Information Theory, vol. 37, No. 6, Nov. 6, 1991, N.Y. U.S., pp. 1577–1585.

*Primary Examiner*—Brian Young
*Attorney, Agent, or Firm*—Frishauf, Holtz, Goodman, Langer & Chick, P.C.

[57] ABSTRACT

A method of modulating digital data to be used for transmitting or recording N-bit (e.g., 8-bit) data comprises a step of converting the input N-bit data into an M+K-bit data selected out of a group of $2^M$ M+K-bit data according to a predetermined rule, the group of $2^M$ M+K-bit data being obtained by adding a K-bit error correction checking symbol to M-bit (e.g., 9-bit) data (N<M). For demodulation, the M+K-bit data is subjected to an error correcting operation or an error detecting operation before it is demodulated into an N-bit data.

46 Claims, 7 Drawing Sheets

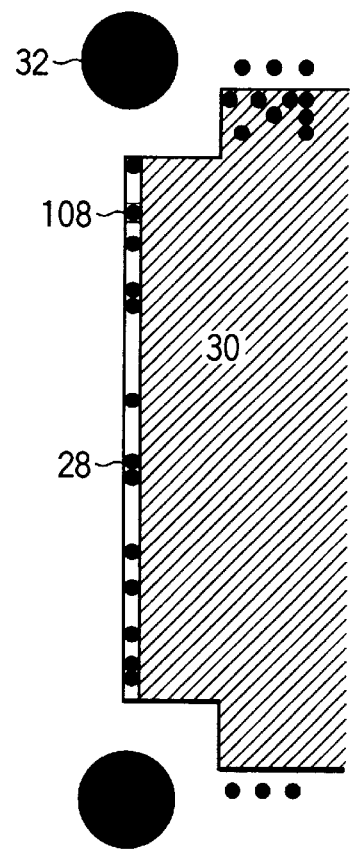
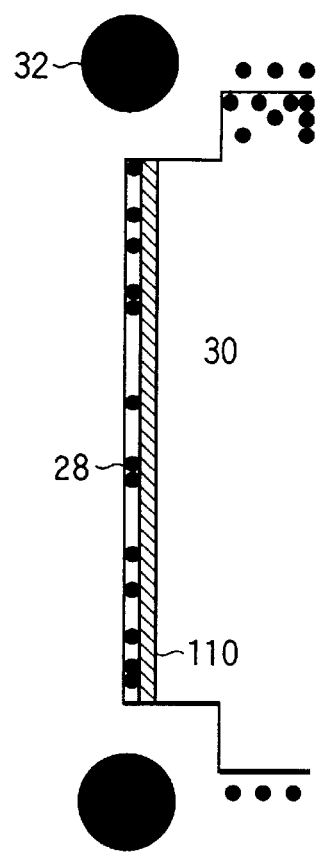
FIG. 11    FIG. 12
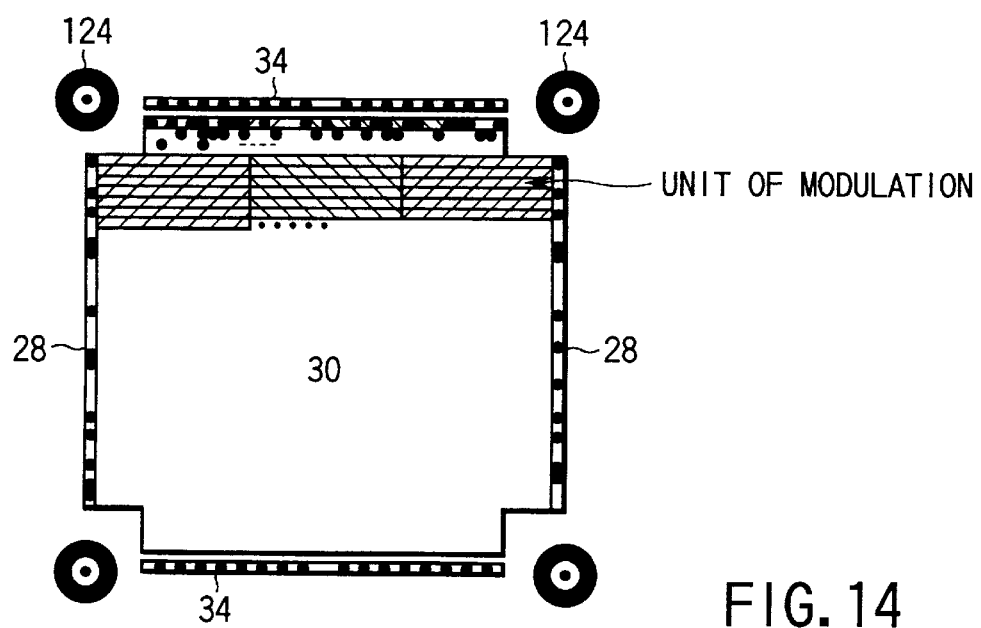
FIG. 14

METHOD OF MODULATING AND DEMODULATING DIGITAL DATA AND DIGITAL DATA MODULATOR/DEMODULATOR

BACKGROUND OF THE INVENTION

This invention relates to a method of modulating and demodulating digital data and also to a digital data modulator/demodulator.

Various methods have been developed for modulating digital data to be recorded on a recording medium in an attempt to make the modulating method adapted to the characteristics of the recording medium. Specifically, in the field of magnetic recording, each original data is typically converted and modulated into a code according to a rule for minimizing the DC components and the number of consecutive bits with a same polarity such as 8–10 modulation or 8–14 modulation before it is recorded.

Jpn. Pat. Appln. KOKAI Publication No. 52-11916 proposes a modulation method of converting a piece of data into a code having no DC component by allowing the number of bits thereof to have a certain degree of redundancy. For example, it discloses a technique of selecting 16 codes out of 20 6-bit codes having no DC component in order to establish a one-to-one correspondence between them and 16 4-bit codes.

Jpn. Pat. Appln. KOKAI Publication No. 60-12840 proposes a method of converting 4-bit data into 6-bit data. With the proposed method, out of 64 different 6-bit data, 16 having no three or more than three consecutive "1"s or "0"s will be selected. For instance, a logic circuit may be used to convert 4-bit data into 6-bit data of the type as described above. The proposed method uses a convert table for obtaining 6-bit data where the number of "1"s is odd and whose least significant bit is generated by means of odd parity of the remaining 5 bits. Additionally, if there appear 4 consecutive "1"s or "0"s as a result of coupling modulation codes, using odd parity, the number of consecutive "1"s or "0"s is reduced to 2 by means of bit inversion.

On the other hand, the applicant of the present patent application proposed in EP 0 670 555 A1 (corresponding to U.S. Ser. No. 08/407,018, now issued as U.S. Pat. No. 5,896,403) a set of dot codes arranged in the form of an optically readable code pattern and recorded on a recording medium such as a sheet of paper and an apparatus for reproducing the recorded dot codes by scanning the pattern. According to this invention, dot codes are modulated before being recorded in such a way that given data are transformed into a pattern of dot codes different from any marker (which consists of a predetermined number of consecutive black dots on the sheet of paper operating as the recording medium). When a marker is recorded as a number of consecutive black dots, the modulated data (a dot image pattern) may contain any number of consecutive white dots. Thus, the applicant of the present patent application proposed a modulation method for limiting the number of consecutive black dots in a dot image pattern, disregarding the number of consecutive white dots in EP 0 765 041 A2 (corresponding to U.S. Ser. No. 08/696,003, now issued as U.S. Pat. No. 5,835,309).

With any of the above described modulation methods, modulation codes are arranged in the form of a table adapted to correspond to all input data strings and stored in a ROM (read only memory).

When reproduced, the modulation codes can violate the modulation rule due to errors in the magneto-electric transformation system when a magnetic recording medium is used or in the image pick-up system (including the use of a binarization process) if a recording system of recording data on a sheet of paper is used. U.S. Pat. No. 5,406,569 describes a method for reducing such errors. The disclosed system will be summarily discussed below.

A modulation code that violates the rule is compared with each of the modulated reference codes prepared on the basis of all the modulation codes in the demodulation table for 1 to 1 correspondence to determine the Hamming distance between itself and the modulated reference code and the modulation code that is violating the rule is transformed into the modulated reference code showing the shortest Hamming distance to it. If there are found two or more than two modulated reference codes that show a same Hamming distance to the violator, each of the bits of the modulation code is weighted on the basis of the probability of occurrence of an error of the bit and the competing reference codes are examined in terms of the weighted bits to determine the modulated reference code showing the shortest Hamming distance to the violator in order to improve the error correction capability.

However, with the method as disclosed in the above cited U.S. Pat. No. 5,406,569, there can remain more than one modulated reference codes that shows a same Hamming distance to the violator after the weighting operation. Then, the method is helpless for error correction and can only detect errors. Additionally, the above discussed method is rather cumbersome because it has to determine the Hamming distance between a modulation code detected as a rule violator and each of the modulated reference does.

The above cited Jpn. Pat. Appln. KOKAI Publication No. 52-11916 describes a method of detecting a modulation code that violates the modulation rule by means of the redundancy inherent to the modulation code. Again, however, this method is helpless for error correction and can only detect errors. Jpn. Pat. Appln. KOKAI Publication No. 62-12840 also discloses a method of detecting errors by means of odd parity that cannot correct errors either. Particularly, this method becomes helpless even for error detection if the parity bit is inverted when two modulation codes are coupled to produce four consecutive "1"s or "0"s.

BRIEF SUMMARY OF THE INVENTION

In view of the above identified problems of the prior art, it is therefore the object of the present invention to provide a method of modulating and demodulating digital data that can detect and correct errors in a simple manner. Another object of the invention is to provide a digital data modulator/demodulator using such a method.

According to a first aspect of the present invention, there is provided a method of modulating digital data to be used for transmitting or recording N-bit data, comprising steps of:

inputting an N-bit data;

converting the input N-bit data into an M+K-bit data selected out of a group of $2^M$ M+K-bit data according to a predetermined rule, the group of $2^M$ M+K-bit data being obtained by adding a K-bit error correction checking symbol to M-bit data (N<M); and outputting the converted M+K-bit data.

According to a second aspect of the present invention, there is provided a method of modulating digital data to be used for transmitting or recording N-bit data, comprising steps of:

inputting an N-bit data;

converting the input N-bit data into an M+K-bit data selected out of a group of L×2$^M$ M+K-bit data according to a predetermined rule, the group of L×2$^M$ M+K-bit data being obtained by adding K-bit error correction checking symbols generated on the basis of L error correcting generation polynomials to M-bit data (N<M) on a one by one basis and in terms of Hamming distance greater than a predetermined value; and outputting the converted M+K-bit data.

According to a third aspect of the present invention, there is provided a method of modulating digital data to be used for transmitting or recording N-bit data, comprising steps of:

inputting an N-bit data;

converting by means of a converting method selected out of R different converting methods the input N-bit data into an $M_i+K_i$-bit data selected out of a group of 2$^{Mi}$ $M_i+K_i$-bit data according to a predetermined rule, the group of 2$^{Mi}$ $M_i+K_i$-bit data being obtained by adding $K_i$-bit error correction checking symbols ($K_i$ being 0 or a positive integer) to $M_i$-bit data (N<M; i=0, 1, 2, 3, . . . , R−1) on a one by one basis; and outputting the converted M+K-bit data along with information data showing the selected converting method.

According to a fourth aspect of the present invention, there is provided a method of demodulating an M+K-bit digital data obtained by a digital data modulating method of converting N-bit data into an M+K-bit data selected out of a group of 2$^M$ M+K-bit data according to a predetermined rule, the group of 2$^M$ M+K-bit data being obtained by adding a K-bit error correction checking symbol to M-bit data (N<M), back into N-bit data, comprising steps of:

carrying out at least one of an error correcting operation and an error detecting operation on the M+K-bit data; and demodulating the M+K-bit data subjected to the at least one of the error correcting operation and the error detecting operation into N-bit data.

According to a fifth aspect of the present invention, there is provided a method of demodulating an M+K-bit digital data obtained by a digital data modulating method of converting the input N-bit into an M+K-bit data selected out of a group of L×2$^M$ M+K-bit data according to a predetermined rule, the group of L×2$^M$ M+K-bit data being obtained by adding K-bit error correction checking symbols generated on the basis of L error correcting generation polynomials to M-bit data (N<M) on a one by one basis and in terms of Hamming distance greater than a predetermined value, into an N-bit data, comprising steps of:

carrying out one of an error correcting operation and an error detecting operation on the M+K-bit data corresponding to each of the L error correction generation polynomials;

demodulating the L M+K-bit data subjected to the one of the error correcting operation and the error detecting operation into L N-bit data; and selecting the most likely N-bit data out of the demodulated L N-bit data and outputting it with the demodulation error identifying information corresponding to the selected N-bit data.

According to a sixth aspect of the present invention, there is provided a method of demodulating an $M_i+K_i$-bit digital data obtained by a digital data modulating method of converting by means of a converting method selected out of R different converting methods the input N-bit into an $M_i+K_i$-bit data selected out of a group of 2$^{Mi}$ $M_i+K_i$-bit data according to a predetermined rule, the group of 2$^{Mi}$ $M_i+K_i$-bit data being obtained by adding $K_i$-bit error correction checking symbols ($K_i$ being 0 or a positive integer) to $M_i$-bit data (N<M; i=0, 1, 2, 3, . . . , R−1) on a one by one basis, the digital data modulating method including a step of outputting the obtained $M_i+K_i$-bit digital data along with information data showing the selected converting method, into an N-bit data, comprising steps of:

extracting the information data showing the selected converting method;

extracting the $M_i+K_i$-bit data according to the extracted information data; and demodulating the extracted $M_i+K_i$-bit data into an N-bit data according to the extracted information data.

According to a seventh aspect of the present invention, there is provided a digital data modulator to be used for transmitting or recording N-bit data, comprising:

an input terminal for inputting an N-bit data;

a converting section for converting the input N-bit data into an M+K-bit data selected out of a group of 2$^M$ M+K-bit data according to a predetermined rule, the group of 2$^M$ M+K-bit data being obtained by adding a K-bit error correction checking symbol to M-bit data (N<M); and an output terminal for outputting the converted M+K-bit data.

According to an eighth aspect of the present invention, there is provided a digital data modulator to be used for transmitting or recording N-bit data, comprising:

an input terminal for inputting an N-bit data;

a converting section for converting the input N-bit data into an M+K-bit data selected out of a group of L×2$^M$ M+K-bit data according to a predetermined rule, the group of L×2$^M$ M+K-bit data being obtained by adding K-bit error correction checking symbols generated on the basis of L error correcting generation polynomials to M-bit data (N<M) on a one by one basis and in terms of Hamming distance greater than a predetermined value; and an output terminal for outputting the converted M+K-bit data.

According to a ninth aspect of the present invention, there is provided a digital data modulator to be used for transmitting or recording N-bit data, comprising:

an input terminal for inputting an N-bit data;

a converting section for converting by means of a converting method selected out of R different converting methods the input N-bit data into an $M_i+K_i$-bit data selected out of a group of 2$^{Mi}$ $M_i+K_i$-bit data according to a predetermined rule, the group of 2$^{Mi}$ $M_i+K_i$-bit data being obtained by adding $K_i$-bit error correction checking symbols ($K_i$=0, 1, 2, 3, . . . ) to $M_i$-bit data (N<M; i=0, 1, 2, 3, . . . , R−1) on a one by one basis; and an output terminal for outputting the converted M+K-bit data along with information data showing the selected converting method.

According to a tenth aspect of the present invention, there is provided a digital data demodulator for demodulating an M+K-bit digital data obtained by a digital data modulating method of converting N-bit data into an M+K-bit data selected out of a group of 2$^M$ M+K-bit data according to a predetermined rule, the group of $2^M$ M+K-bit data being obtained by adding a K-bit error correction checking symbol to M-bit data (N<M), back into N-bit data, comprising:

an error correcting section carrying out at least one of an error correcting operation and an error detecting operation on the M+K-bit data; and a demodulating section for demodulating the M+K-bit data subjected to the at least one of the error correcting operation and the error detecting operation into N-bit data.

According to a eleventh aspect of the present invention, there is provided a digital data demodulator for demodulating an M+K-bit digital data obtained by a digital data modulating method of converting the input N-bit into an M+K-bit data selected out of a group of L×$2^M$ M+K-bit data according to a predetermined rule, the group of L×$2^M$ M+K-bit data being obtained by adding K-bit error correction checking symbols generated on the basis of L error correcting generation polynomials to M-bit data (N<M) on a one by one basis and in terms of Hamming distance greater than a predetermined value, into an N-bit data, comprising:

an error correcting section for carrying out one of an error correcting operation and an error detecting operation on the M+K-bit data corresponding to each of the L error correction generation polynomials;

a demodulating section for demodulating the L M+K-bit data subjected to the one of the error correcting operation and the error detecting operation into L N-bit data; and an output section for selecting the most likely N-bit data out of the demodulated L N-bit data and outputting it with the demodulation error identifying information corresponding to the selected N-bit data.

According to a twelfth aspect of the present invention, there is provided a digital data demodulator for demodulating an $M_i$+$K_i$-bit digital data obtained by a digital data modulating method of converting by means of a converting method selected out of R different converting methods the input N-bit into an $M_i$+$K_i$-bit data selected out of a group of $2^{Mi}$ $M_i$+$K_i$-bit data according to a predetermined rule, the group of $2^{Mi}$ $M_i$+$K_i$-bit data being obtained by adding $K_i$-bit error correction checking symbols ($K_i$ being 0 or a positive integer) to $M_i$-bit data (N<M; i=0, 1, 2, 3, . . . , R−1) on a one by one basis, the digital data modulating method including a step of outputting the obtained $M_i$+$K_i$-bit digital data along with information data showing the selected converting method, into an N-bit data, comprising:

an information data extracting section for extracting the information data showing the selected converting method;

a bit data extracting section for extracting the $M_i$+$K_i$-bit data according to the extracted information data; and a demodulating section for demodulating the extracted $M_i$+$K_i$-bit data into an N-bit data according to the extracted information data.

According to a thirteenth aspect of the present invention, there is provided a method of modulating digital data to be used for printing and recording an N-bit data on a predetermined medium as optically readable code pattern, wherein the code pattern is formed by arranging a plurality of blocks having a predetermined area adapted to hold a predetermined volume of data, the block at least comprising: a pattern formed by a plurality of dot images arranged in correspondence with the held data; a marker arranged with a predetermined positional relationship with the dot image pattern to determine a reference position for reading the dot image pattern; and a block address pattern for indicating the positions of the blocks of the code pattern and, when an N-bit data is converted into an M-bit data selected out of a group of $2^M$ N-bit data (N<M) according to a predetermined rule and data values of the M-bit data are caused to correspond to respective dot images of predetermined colors, the total number of dot images contained in each of the blocks is made equal to a value obtained by multiplying the M by an integer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 11 is a schematic illustration showing where the code pattern of a modulation change-over flag is recorded in the fourth and fifth embodiments of the invention.

FIG. 12 is a schematic illustration of the physical format of the blocks that constitute a code pattern to be used for the fourth embodiment.

FIG. 14 is a schematic illustration of the physical format of the blocks that constitute an alternative code pattern that can be used for the purpose of the invention.

DETAILED DESCRIPTION OF THE INVENTION

Embodiments of the present invention will be described below.

[1st Embodiment]

Now, a modulation method and a modulator according to the invention will be described by referring to the first embodiment.

Figure 1:
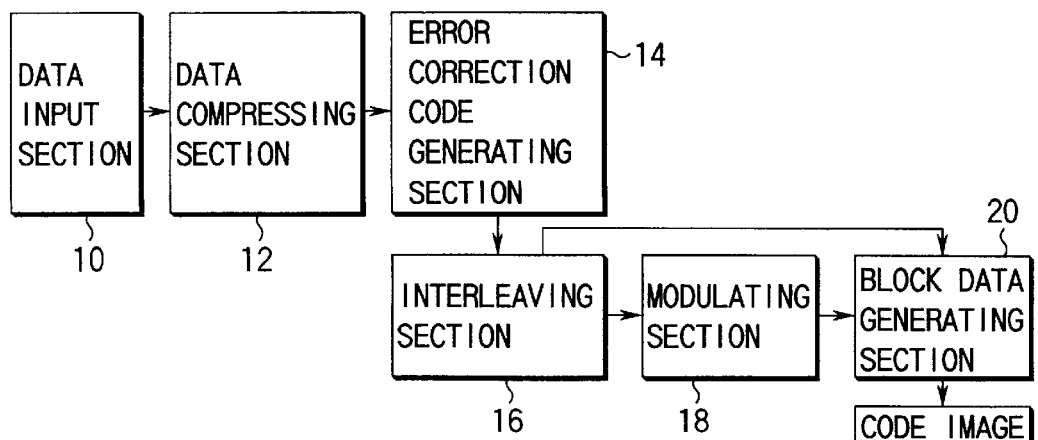
FIG. 1 is a schematic block diagram of a first embodiment of the invention.

FIG. 1 is a schematic block diagram of a dot code recording apparatus to which the first embodiment of modulation method and modulator according to the invention are applied. The dot code recording apparatus comprises a data input section 10, a data compressing section 12, an error correction code generating section 14, an interleaving section 16, a modulating section 18, a block data generating section 20, a code image forming section 22 and an output section 24.

Figure 2:
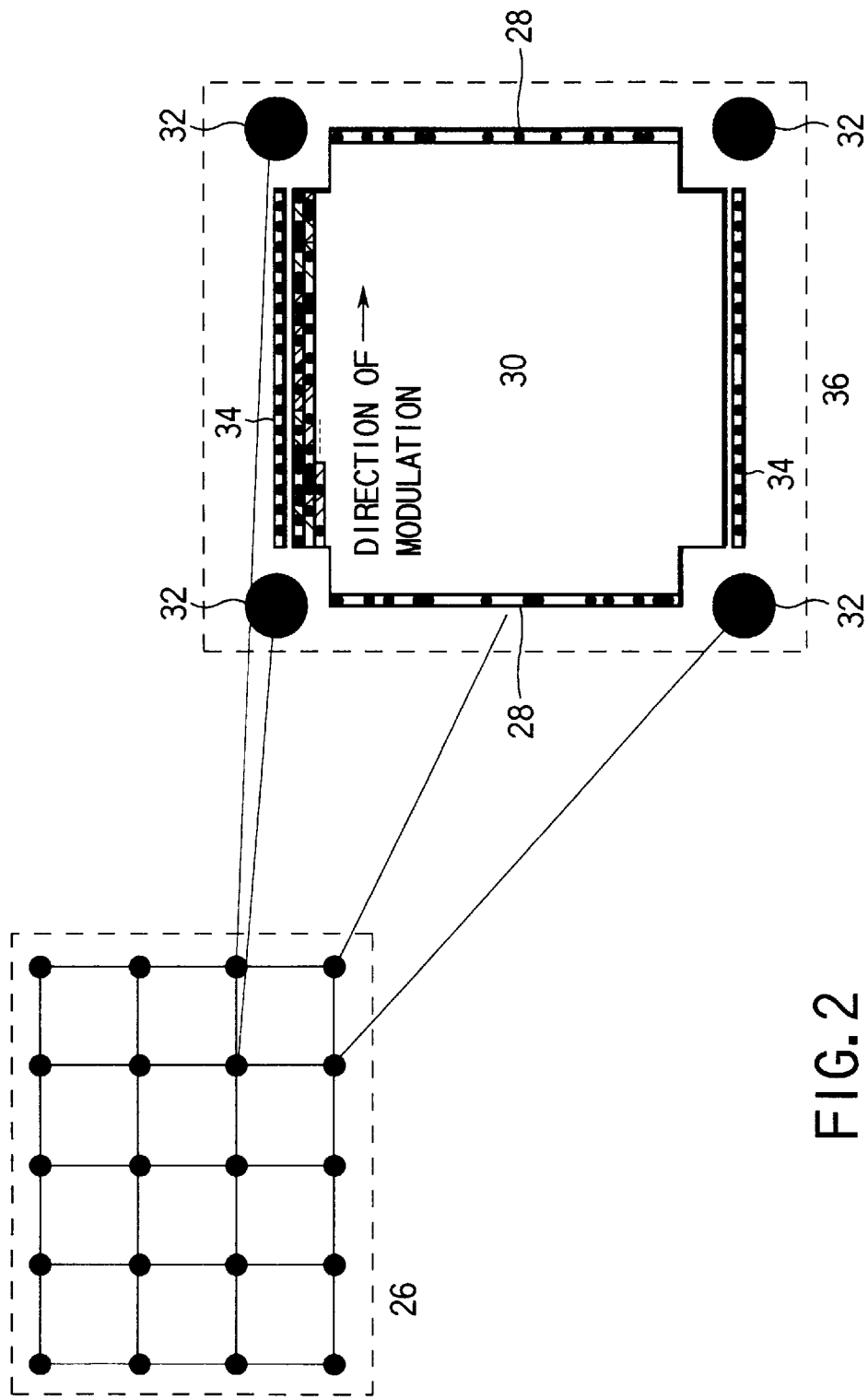
FIG. 2 is a schematic illustration of an optically readable code pattern to be used for the first embodiment.

The data input section 10 is used to input multimedia information including voice, image and text and transform them into digital data. The data compressing section 12 operates to compress the digital data produced from the data input section 10 by transforming the input data in a predetermined manner. The error correction code generating section 14 adds an error correction checking symbol to the data compressed by the data compressing section 12 and generates error correction codes. The interleaving section 16 performs an interleaving operation to the error correction codes generated by the error correction code generating section 14. The modulating section 18 converts the data interleaved by the interleaving section 16 into modulation codes (as will be described in greater detail hereinafter). The block data generating section 20 collects a predetermined number of modulation codes converted by the modulating section 18 to form a block and generates and adds a header to the block. The code image forming section 22 generates image data in the form of a code pattern 26 of dot codes as shown in FIG. 2 from the data of the block generated by the block data generating section 20. In other words, it transforms the block data into black and white dots in block header 28 and block user data 30 regions for the code pattern 26 of dot codes and generates image data out of them that are accompanied by markers 32 and pattern codes 34. Finally, the output section 24 outputs the image data of the code pattern 26 generated by the code image forming section 22 to a printer or some other recording device.

In the following description, voice is used for input data and any error correction code is a Reed-Solomon code. Additionally, the output code image will be a bit map image of an optically readable code pattern 26 as shown in FIG. 2 that comprises one or more than one blocks 36, each of which constituted by a block header 28, block user data 30 including a plurality of dot images, a marker 32 and a pattern code 34, although the present invention is not limited thereto in any means.

Now, the operation of the first embodiment will be described in detail.

Firstly, voice information entered by way of a microphone (not shown) is subjected to A/D conversion and transformed into digital voice in the data input section 10.

The digital voice obtained by the transformation is then subjected to a data compressing operation of waveform coding such as ADPCM (adaptive differential pulse code modulation) or of analytic/synthetic coding such as CELP (code excited linear prediction). Additionally, identification data for identifying (the data type, the compression ratio and mode, the data volume, etc. of) the input data and the data compressing operation are added as header to the compressed voice data, which are then sent into the error correction code generating section 14.

Then, an error correction code checking symbol is added to every predetermined number of bytes of the compressed voice data entered to the error correction code generating section 14. Any error correction code checking symbol as used herein is a Reed-Solomon code checking symbol. For example, an error correction code checking symbol of 16 bytes may be added to every 72 bytes of data. The Reed-Solomon code generating polynomial as used in this embodiment has roots of $\alpha^l, \alpha^{l+1}, \ldots, \alpha^{l+d-2}$ for primitive element $\alpha$ on Galois field $GF(2^8)$, where d represents the smallest Hamming distance and l represents a positive integer equal to or smaller than 254−(d−2), which may be equal to zero. Then, a plurality of 88 bytes Reed-Solomon codes, each having a checking symbol, are entered to the interleaving section 16.

The plurality of Reed-Solomon codes entered to the interleaving section 16 are temporarily stored in an internal memory (not shown). Then, the stored data are interleaved when a predetermined number of Reed-Solomon codes are accumulated there or according to the accumulated number of codes so that they can readily be used to cope with burst errors. The interleaving method and the format of correction code are described the header (which is a macro block header as described in EP 0 713 194 A1 (corresponding to U.S. Ser. No. 08/586,792, now issued as U.S. Pat. No. 5,989,709) proposed by the applicant of the present patent application). The header is then inserted into and added to the interleaved data in a distributed manner according to the volume of the data stored in the memory. A description of the rule for the distribution and the insertion (macro block header distribution information) is then entered to the block data generating section 20 and recorded in the block header 28 as will be described hereinafter. The interleaved data and header are modulated by every unit of bytes for the above error correction and then input to the modulating section 18 (although a byte unit of a Reed-Solomon code corresponds to 8 bits in this embodiment, it does not necessarily have to do so long as it is equal to a data unit to be modulated (as will be described hereinafter)).

Each byte data entered to the modulating section 18 corresponds to an address of the built-in modulation table ROM (not shown) and the contents of the address are output to the block data generating section 20 as a modulation code.

Now, the contents of the modulation table will be described below in detail. Note that the modulation rule of an optically readable code pattern printed on a sheet of paper as shown in FIG. 2 will be described, although the modulation rule depends on the transmission mode, the characteristics of the recording medium and the contents of the physical data format.

A code pattern 26 comprises blocks 36, each of which by turn comprises a marker 32 to be used as reference, a pattern code 341 a block header 28 and block user data 30. Since the method for optically reading a code pattern 26 as used herein is described in detail in EP 0 717 398 A2 (corresponding to U.S. Ser. No 08/571,776, now issued as U.S. Pat. No. 5,866,895) filed by the applicant of the present patent application, it will be described only briefly below.

It is a method with which an image of the code pattern 26 is picked up by means of an image pick-up system and markers 32 are detected from the binarized image that is obtained from the picked-up image to precisely determine the location where the operation of reading the block header 28 and the block user data 30 is conducted so that each 1-bit data can be retrieved as a white or black dot at the determined location.

With this technique, the markers 32 have to be detected firstly from the picked-up binary image. Particularly care should be taken when a marker is detected as a region of consecutive black dots and a same pattern of consecutive black dots is be detected also in the remaining regions, particularly in the block user data 30, because the latter is erroneously recognized as a marker so that consequently the subsequent operation of detecting the pattern code 34 and reading the block header 28 and the block user data 30 will be baffled.

In order to avoid detection of wrong markers, the block user data 30 are modulated so that a pattern same as that of any of the markers 32 operating as reference may not appear. The rule used for the modulation in this embodiment is described in EP 0 765 041 A2 (corresponding to U.S. Ser. No. 08/696,003, now issued as U.S. Pat. No. 5,825,309) filed by the applicant of the present patent application, according to which no three or more than three consecutive dots will be arranged in the direction parallel with the pattern code 34, although the number may vary depending on the size of the markers 32 and hence is not fixed in any means.

Figure 3:
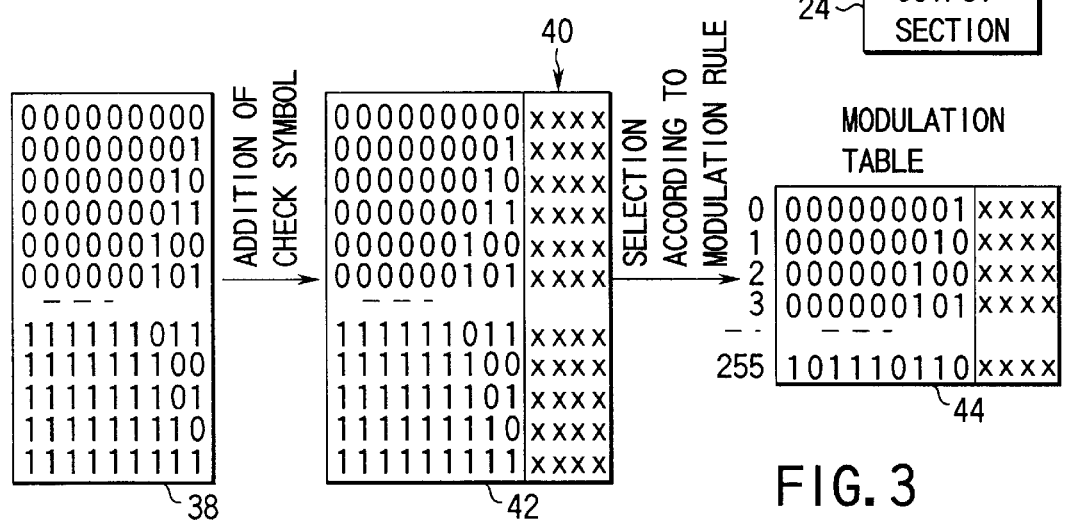
FIG. 3 is a schematic illustration of the modulation process of the first embodiment.

FIG. 3 is a schematic illustration showing how a modulation table is prepared in this embodiment. Referring to FIG. 3, firstly a 13-bit data 42 will be formed from each of a total of 512 9-bit (=M) data 38 by adding a 4-bit (=K) error correction code checking symbol 40 thereto as error correction code. Note that "9" is selected as a number greater than the number of bits of a byte (which is equal to "8" (=N) in this embodiment). The error correction code is a BCH (Bose-Chaudhuri-Hocquenghem) code formed by means of generation polynomial $G(x)=x^4+x^3+1$ having original element $\alpha$ of Galois field GF ($2^4$) as root. The checking symbol (4-bit) may be subjected to a bit inversion or alternatively generation polynomial $G(x)=x^4+x+1$ may be used. Bit inversion provides an effect of detecting, as an error, a code whose bits are all "0"s that can be generated for some reason or another.

Then, 256 13-bit data will be selected as modulation codes 44 out of the generated 512 13-bit data according to the modulation rule. The modulation rule provides that there shall be 3 or less consecutive "1"s in each 13-bit data and neither the most nor the least significant bit shall be related to more than 2 consecutive "1"s. With this arrangement, the number of consecutive "1"s in a data string obtained by coupling a plurality of 13-bit modulation codes will not exceed four.

Then, the selected 256 modulation codes 44 are made to show one-to-one correspondence with the byte data before the modulation. This procedure is reflected by the cost particularly when a logic circuit is used for demodulation. The above procedure will not be described here any further because the demodulation process is based on a ROM table in this embodiment.

The 13-bit modulation codes are then entered to the block data generating section 20 and collected for the number equal to the number of recordable modulation codes of the block user data 30 in the code pattern 26 shown in FIG. 2 to produce block user data information. Additionally, a block address and the above described macro bock header distributing information sent from the interleaving section 16 are arranged at respective predetermined bit positions of each piece of the block user data information and an error correction code checking symbol (a BCH code checking symbol) is added thereto to generate block header information. Then, block data containing block header information and user data information as a unit will be generated.

The above block data are then entered to the code image forming section 22 to produce a bit map image of the code pattern 26. More specifically, each of the bits used for the block header information is transformed for the corresponding black or white dot of the block header 28, while each of the above 13 bits is transformed for the corresponding black or white dot image in the block user data 30. Note that a bit is transformed into a black dot if it is equal to "1", whereas it is transformed into a white dot if it is equal to "0". Also note that white dots will not have to be printed at all.

The block user data are arranged from the block 36 at the upper left corner and in parallel with the pattern code 34. Then, marker 32 and pattern code 34 are added to the predetermined respective positions of the block by the code image forming section 22 to produce a complete block. In the code pattern 26, each block shares regions for marker 32, pattern code 34 and block header 28 with adjacently located blocks.

Then, the number of consecutive black dots of any two blocks that are located adjacently in the direction parallel to the pattern codes 34 can be held equal to or less than a predetermined number (5 in this embodiment) by defining the modulation rule to arrange the physical format of the code pattern 26 in order to agree a partition for the modulation codes with the boundary of the unmodulated block header 28 and the modulated block user data 30.

While the logical structure of the block header 28 and the block user data 30 is not described in detail above, it may preferably be identical with the one described in EP 0 713 194 A1 (corresponding to U.S. Ser. No. 08/586,792, now issued as U.S. Pat. No. 5,898,709).

While block data are prepared by the block data generating section 20 after producing modulation codes 44 in the above embodiment, alternatively, block data may be prepared prior to modulation codes and recorded as part of block user data 30 while the latter are modulated in the code image forming section 22.

The bit map image of the generated code pattern 26 is then transmitted from the code image forming section 22 to the output section 24, which transforms it into data that can be recognized by a printing press or a printer and outputs them to the latter.

Thus, the modulation codes modulated by the above described modulating method are recorded as an optically readable dot image that is free from the detection of wrong markers so that errors that can occur at the time of demodulation due to blurred and/or expanded dots and stains adhering to the sheet of paper after the printing can be eliminated effectively and efficiently to minimize the error rate after the demodulation.

[2nd Embodiment]

Now, a demodulation method and a demodulator according to the invention will be described by referring to the second embodiment.

Figure 5:
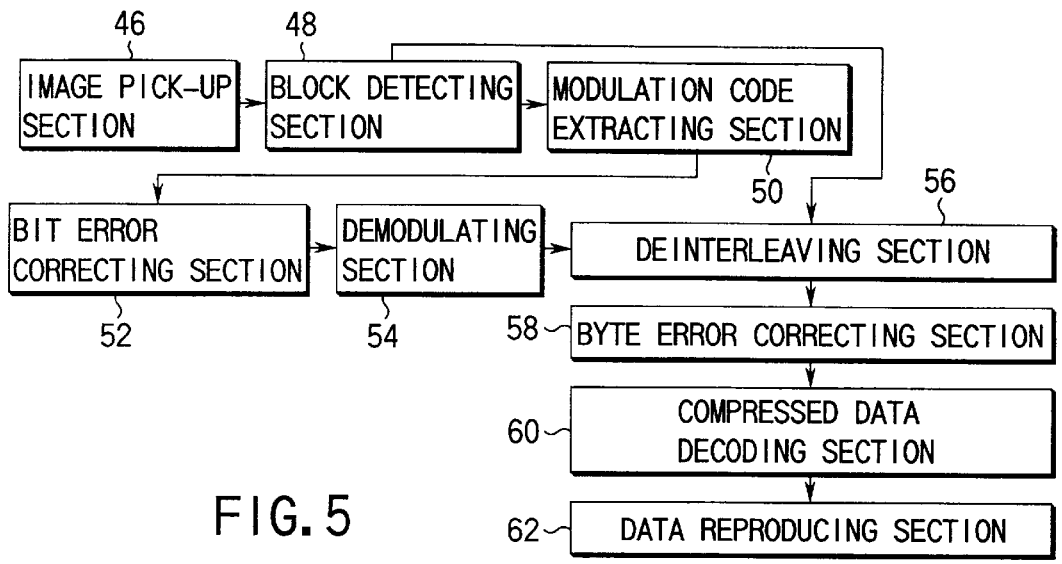
FIG. 5 is a schematic block diagram of a second embodiment of the invention.

FIG. 5 is a schematic block diagram of a dot code reproducing apparatus to which the second embodiment of demodulation method and demodulator according to the invention are applied. The dot code reproducing apparatus comprises an image pick-up section 46, a block detecting section 48, a modulation code extracting section 50, a bit error correcting section 52, a demodulating section 54, a deinterleaving section 56, a byte error correcting section 58, a compressed data decoding section 60 and a data reproducing section 62.

The image pick-up section 46 picks up an optically readable code pattern and generates a digital image. The block detecting section 48 detects blocks of dot codes from the generated digital image and extracts the black header of each of the detected blocks. The modulation code extracting section 50 extracts modulation codes from the block user data and the bit error correcting section 52 operates to correct errors that can be found in the extracted modulation codes. The demodulating section 54 generates demodulation data for the modulation codes that have been subjected to a bit error correcting operation of the bit error correcting section 52. The deinterleaving section 56 temporarily stores the demodulation data generated by the demodulating section 54 in an internal memory (not shown) and rearranges the plurality of pieces of demodulation data stored in the memory. The byte error correcting section 58 performs a byte error correcting operation on the rearranged pieces of demodulation data and the compressed data decoding section 60 decodes the compressed data that have been corrected for byte errors by decompressing them to restore the original multimedia data in the form of a combination of voice, image and text. The data reproducing section 62 transforms the restored multimedia data into data that can be recognized by an output unit (not shown) and sends them to the output unit.

While it is assumed here that the code pattern has a configuration as shown in FIG. 2 and modulation codes are 13-bit modulation codes as described by referring to the first embodiment, whereas the operation of bit error correction and that of byte error correction are respectively an operation of correcting BCH codes and that of correcting Reed-Solomon codes and data are output as voice data, it should be noted that the present invention is not limited thereto in any means.

Now, the operation of the second embodiment will be described in detail.

The image pick-up section 46 picks up an image of the code pattern 26 typically by means of a CCD camera and binarizes it to produce a binarized image.

The produced binarized image is then entered to the block detecting section 48, which detects blocks 36 from the entered binarized image and determines the positions for reading the block header 28 and the block user data 30. Then, the block address and the macro block header distribution information contained in the block header 28 read out at the determined reading position are transmitted to the deinterleaving section 56. The logical structure of the block address and that of the macro block header distribution information are described in detail in EP 0 713 194 A1 (corresponding to U.S. Ser. No. 08/586,792, now issued as U.S. Pat. No. 5,898,709) filed by the applicant of the present patent application and hence will not be described here.

The modulation code extracting section 50 determines each of the bits read out at the position for reading the block user data for black or white and transforms them into bit data in order to extract 13-bit modulation codes.

Figure 6:
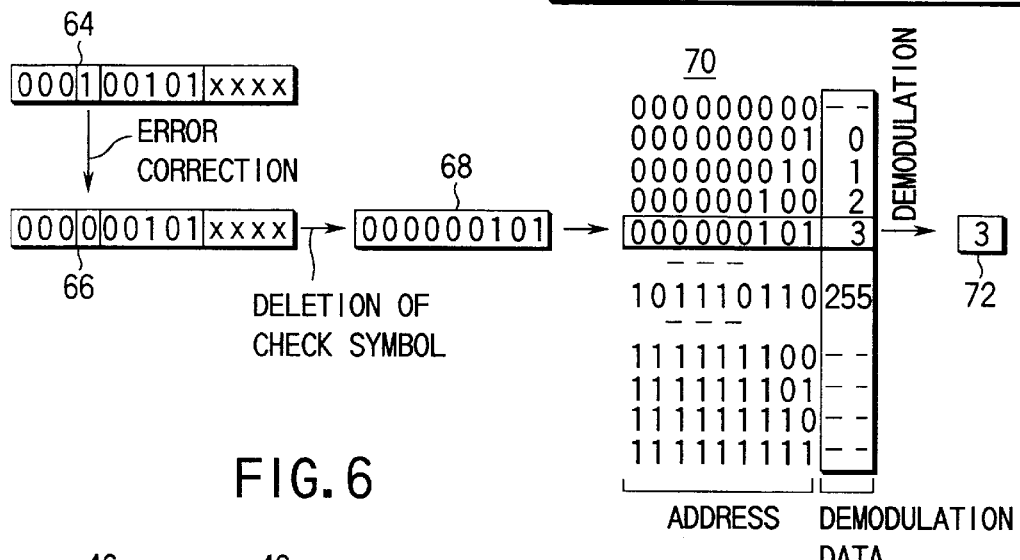
FIG. 6 is a schematic illustration of the error correction and demodulation process to be conducted on modulation codes for the second embodiment.

Then, the extracted modulation codes are demodulated in a manner as described below by also referring to FIG. 6.

The 13-bit modulation codes 64 extracted by the modulation code extracting section 50 are then entered to the bit error correcting section 52 for error correction. The error correcting operation of the bit error correcting section 52 is an operation of decoding BCH codes as will be briefly described below.

Firstly, syndrome s is determined from multiplication of 13-bit modulation code 64 which is expressed by V and check matrix H;

$$s = H \cdot V$$

where H is expressed by equation below;
 $H = (\alpha^{12}, \alpha^{11}, \alpha^{10}, \alpha^9, \alpha^8, \alpha^7, \alpha^6, \alpha^5, \alpha^4, \alpha^3, \alpha^2, \alpha, 1)$, $\alpha$ being the primitive element of $GF(2^4)$.

The above modulation code V is expressed by addition of error-free modulation code $V_0$ and error vector $\epsilon$ (=exclusive logical OR) and therefore syndrome s is also expressed by equation below;

$$s = H \cdot V = H \cdot (V_0 + \epsilon) = H \cdot V_0 + H \cdot \epsilon = H \cdot \epsilon,$$

where $H \cdot V_0 = 0$.

For example, if the least significant bit of modulation code V is the 0-th bit and the seventh bit has an error, then error vector $\epsilon$ will be expressed as follows.

$\epsilon = (0, 0, 0, 0, 0, 1, 0, 0, 0, 0, 0, 0, 0)$

Then, syndrome s will be expressed as follows.

$$s = \alpha^7$$

Thus, the bit position where syndrome s shows the 7-th power contains an error so that the operation of correcting a 1-bit error is reliably performed by inverting the bit position.

The smallest Hamming distance of a 13-bit modulation code that can be used for this embodiment is equal to 3 and, therefore this embodiment is so adapted that it can correct only a single 1-bit error. In other words, if there occurs an error for two or more than two bits in a modulation code with this embodiment, multiple error correcting operations can take place to consequently increase the number of bit errors. On the other hand, the operation of correcting byte errors of the byte error correcting section 58 is conducted on the basis of an error unit of a byte as will be described hereinafter and, therefore, a byte error can contain a plurality of bit errors in a byte. Thus, the number of bit errors given rise to by multiple error correcting operations can be limited to the number of bits in a byte by making a modulation code (a demodulation data) correspond to a byte.

Therefore, if the number of bit errors is raised by multiple error correcting operations in each demodulation data, the number of byte errors and hence the outcome of byte error correcting operations of the embodiment will not be affected at all as a result. Conversely, since a modulation code containing a bit error can be corrected perfectly, the number of bit errors immediately prior to a byte error correcting operation will be reduced without fail to dramatically improve the final error rate that can be obtained when the byte error correcting process is completed.

The modulation codes 66 that have been subjected to an error correcting process are then entered to the demodulating section 54, where the error correction checking symbol (4 bits) is removed from each modulation code to produce a 9-bit data, which is then used as an address 68 of the 9-bit demodulation table 70. Then, the 8-bit data of the demodulation table 70 that corresponds to the produced address 68 is entered to the deinterleaving section 56 as demodulation data.

The above described processing operation of the demodulating section 54 utilizes a demodulation table 70 to demodulate modulation codes. It will be appreciated that the error correction checking symbol is removed from each 13-bit data to reduce the number of bits of each reference address from thirteen to nine in order to minimize the size of the demodulation table. However, it will be appreciated that the demodulating operation can be conducted by means of a logic circuit (which may include logical AND, OR and/or NOT circuits) without using a demodulation table. If such is the case, a data from which the error correction checking symbols is removed may devoid of information effective for logical operations and consequently a large circuit may be required to handle such data. Therefore, in this case, a 13-bit data is preferably sent directly to the logic circuit without removing the error correction checking symbols therefrom to output a 8-bit data.

The demodulation data 72 sent to the deinterleaving section 56 is then temporarily stored in an internal memory (not shown) and, when the demodulation data stored in the memory get to a predetermined volume that is based on the interleave-related information contained in the headers located in the respective positions determined by means of the macro block header distribution information, the stored pieces of demodulation data are rearranged on the basis of unit to generate an error correction code (Reed-Solomon code) to be used for the error correcting operation of the byte error correcting section 58. The rearranging operation is exactly the reverse of the interleaving operation conducted at the time of generating codes.

The correction code to be used by the byte error correcting section 58 is a Reed-Solomon code that handles a demodulation data 72 as a byte as described above and, therefore, the generating polynomial has roots of at, $\alpha^l, \alpha^{l+1}, \ldots, \alpha^{l+d-2}$ for primitive element $\alpha$ of $GF(2^8)$, where d represents the smallest Hamming distance and l represents a positive integer equal to or smaller than 254–(d–2), which may be equal to zero.

Since the procedure of decoding a Reed-Solomon code is not essential to the present invention, it will be described only briefly below.

Firstly, syndrome $S_{RS}$ is determined from multiplication of check matrix $H_{RS}$ and Reed-Solomon code $V_{RS}$.

Then, error position polynomial $\sigma(x)$ and error pattern polynomial $\omega(x)$ are determined from the obtained syndrome $S_{RS}$ by means of the Euclidean algorithm. The roots of the determined error position polynomial $\alpha(x)$ are then determined by the chain search technique to determine the error positions. Finally, an error pattern is produced from the roots of the error position polynomial $\alpha(x)$ and the error pattern polynomial $\omega(x)$. The relationship between the number of errors L of a Reed-Solomon code that can be corrected and the smallest Hamming distance d is expressed by the formula below.

$$2L \leq d-1$$

A Reed-Solomon code is uncorrectable (including error correction) unless the number of byte errors in the code satisfies the above formula. Thus, the number of byte errors is reduced by bit error correction at the time of demodulating the modulation code before the Reed-Solomon code correcting operation to significantly reduced the probability of unable correction for the Reed-Solomon code.

The compressed voice data obtained after the above described operation of correcting the Reed-Solomon code are then entered to the compressed data decoding section 60, which decodes the compressed data by following a predetermined procedure to restore the original voice data. The restored voice data are then entered to the data reproducing section 62, which carries out an N-times over-sampling operation, a low-pass filtering operation and an operation of D/A conversion on the entered voice data before they are sent to an amplifier.

With the operation of reading an optically readable code pattern of modulation codes produced by means of the above described modulating method, the modulation codes in each block can be extracted without detecting wrong markers and a predetermined number of errors that can occur in any of the modulation codes in the demodulating step can be reliably corrected so that the error correction capability of the subsequent steps does not have to be enhanced disproportionally and the data error rate of the output voice data can be minimized. Additionally, the use of a recording medium that inherently shows a high error rate can be made feasible. (Note that, in the case of high quality or medium quality paper, ink or toner may not wet the paper evenly and blurred and/or expanded dots can appear frequently to give rise to a high error rate on a dot basis).

While errors are not detected during the error correcting operation at the time of demodulating modulation codes in the above description, it will be appreciated that errors can be detected without problem at the time of demodulating modulation codes and the information obtained through the error detecting operation can be used by the byte error correcting section 58 as deletion-related information (information for identifying demodulation errors). If only an error detecting operation is conducted at the time of demodulating modulation codes, up to two bit errors can be reliable detected in each 13-bit modulation code so that the deletion-related information (information for identifying demodulation errors) can also reliably be detected to effectively exploit the potential of correcting and/or deleting data.

[3rd Embodiment]

Now, a demodulation method and a demodulator according to the invention will be described by referring to the third embodiment.

Figure 7:
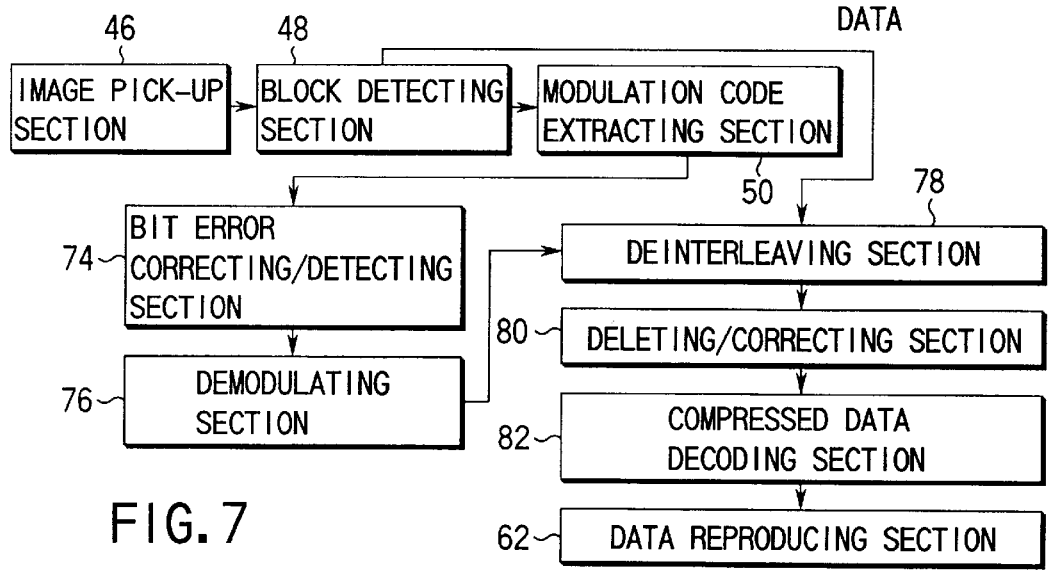
FIG. 7 is a schematic block diagram of a third embodiment of the invention.

FIG. 7 is a schematic block diagram of a dot code reproducing apparatus to which the third embodiment of demodulation method and demodulator according to the invention are applied. The dot code reproducing apparatus comprises an image pick-up section 46, a block detecting section 48, a modulation code extracting section 50, a bit error correction detecting section 74, a demodulating section 76, a deinterleaving section 78, a deleting/correcting section 80, a compressed data decoding section 82 and a data reproducing section 62.

The image pick-up section 46 picks up an optically readable code pattern and generates a digital image. The block detecting section 48 detects blocks of dot codes from the generated digital image and extracts the black header of each of the detected blocks. The modulation code extracting section 50 extracts modulation codes from the block user data.

The bit error correction detecting section 74 operates to correct errors of a plurality of different types that can exist in the modulation codes extracted by the modulation code extracting section 50. The demodulating section 76 generates demodulation data for each of the modulation codes that have been subjected to a bit error correcting operation of the bit error correction detecting section 74 and selects one of them. It also outputs information for identifying demodulation errors. The deinterleaving section 78 temporarily stores the demodulation data and the information for identifying demodulation errors generated by the demodulating section 76 in an internal memory (not shown) and rearranges the plurality of pieces of demodulation data and those of information for identifying demodulation errors stored in the memory. The deleting/correcting section 80 operates for deleting/correcting data on the rearranged pieces of demodulation data on the basis of the rearranged pieces of information for identifying demodulation errors and the compressed data decoding section 82 decompress and decodes the compressed data that have been subjected to a byte error correcting operation to restore the original multimedia data in the form of a combination of voice, image and text.

The data reproducing section 62 transforms the restored multimedia data into data that can be recognized by an output unit and sends them to the output unit.

While it is assumed here that the code pattern has a configuration as shown in FIG. 2 and the deleting/correcting operation is that of correcting Reed-Solomon codes, whereas data are output as voice data, it should be noted that the present invention is not limited thereto in any means.

Now, the operation of the third embodiment will be described in detail. The steps from that of picking a code pattern 26 to that of extracting modulation codes are identical with those of the second embodiment and hence will not be described here.

Figure 8:
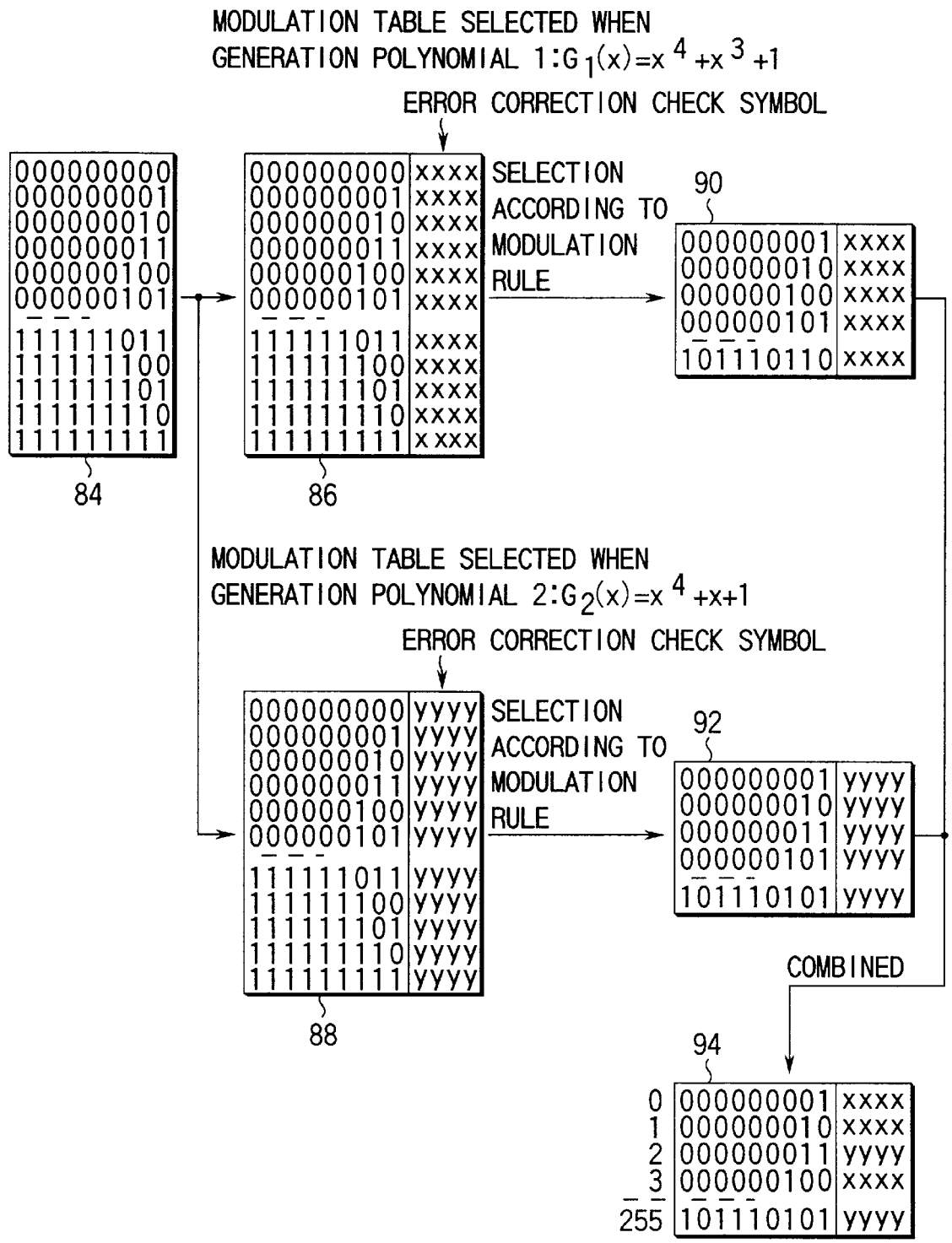
FIG. 8 is a schematic illustration of the modulation process of the third embodiment.

FIG. 8 shows the modulation rule to be applied to the modulation codes that have been extracted in a manner as described above.

While the modulation rule of this embodiment is same as that of the first embodiment to the extent that 8-bit data are converted into 13-bit data, they differ from each other as described below.

Referring to FIG. 8, firstly, a 4-bit error correction checking signal is added to each of a total of 512 9-bit data 84 to generate two different sets of 13-bit BCH codes 86, 88. The first set of BCH codes 86 is formed from generation polynomial $G_1(x)=x^4+x^3+1$ having original element $\alpha$ of Galois field GF ($2^4$). The second set of BCH codes 88 is formed from generation polynomial $G_2(x)=x^4+x+1$ having original element $\beta$ of Galois field GF ($2^4$).

Then, codes conforming to the modulation rule that there shall be 3 or less consecutive "1"s in each bit data and the most significant bit shall not be related to more than 2 consecutive "1"s, while the least significant bit shall not be related to any consecutive "1"s if it is "1"(or vice versa) will be selected from each of the two sets of BCH codes 86, 88 to generate a first modulation table 90 and a second modulation table 92 respectively. The modulation tables 90, 92 contains 253 modulation codes and 252 modulation codes respectively. The third modulation table 94 shown is formed by selecting 256 modulation codes from the modulation codes of the first and second modulation tables 90, 92. With the third modulation table 94, no consecutive four "1"s will be generated.

While each of the first and second modulation tables 90, 92 is constituted of a group of modulation codes having the shortest Hamming distance 3, modulation codes showing a large Hamming distance should be selected because the shortest Hamming distance can become too short when the modulation codes of the groups are mixed with each other. For example, all the 253 modulation codes of the first modulation table 90 may be selected and the remaining three may be selected from the second modulation table 92 in such a way that the three show the shortest Hamming distance of 2 with the 253 modulation codes of the first modulation table 90.

With this arrangement, the third modulation table 94 will be an unusual table where codes with the shortest Hamming distance of 2 are mixed with the remaining codes with the shortest Hamming distance of 3 (which are the 253 modulation codes of the first modulation table 90).

With this unusual modulation table, 1-bit errors that can be produced on a modulation code basis cannot be reliably corrected. Particularly, when an erroneously modulation code is located between a pair of codes with the shortest Hamming distance of 2, it will not be able to decide which one of the codes should be used to correct the error.

Figure 9:
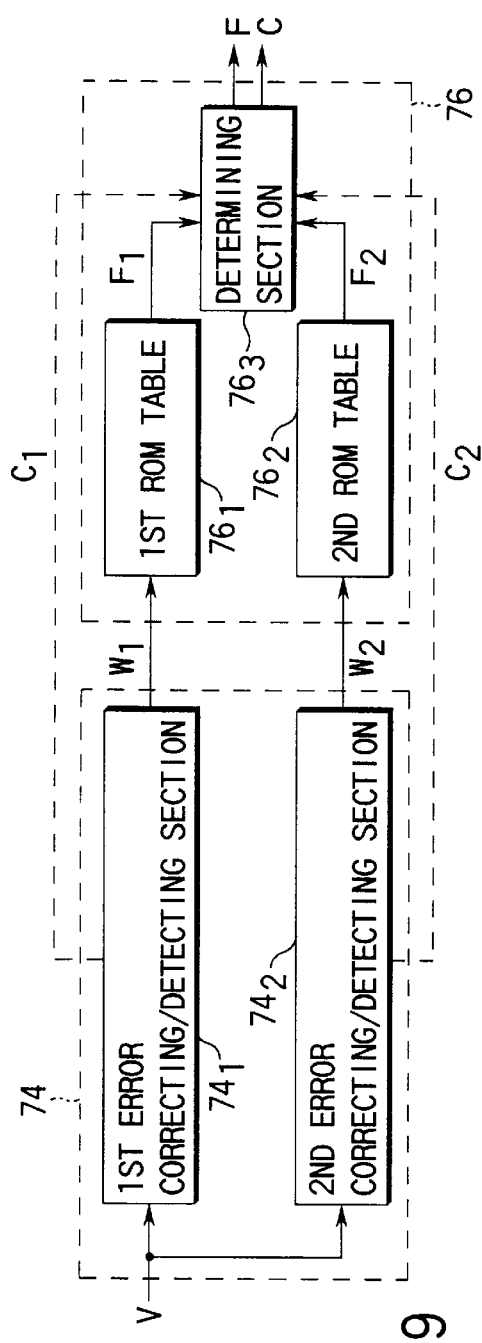
FIG. 9 is a schematic block diagram of bit error correcting/detecting section and demodulation section shown in FIG. 7.

FIG. 9 schematically shows the configuration of the bit error correction detecting section 74 and the demodulating section 76 adapted to the use of such an unusual modulation table.

Firstly, modulation code V is input to the first error correction detecting section $74_1$ and the second error correction detecting section $74_2$ and then syndrome $s_1$ and $s_2$ are determined respectively on the basis of the check matrix $H_1$ and the check matrix $H_2$;

$H_1=(\alpha^{12}, \alpha^{11}, \alpha^{10}, \alpha^9, \alpha^8, \alpha^7, \alpha^6, \alpha^5, \alpha^4, \alpha^3, \alpha^2, \alpha, 1)$, $\alpha$ being the primitive element of GF($2^4$), $H_2=(\beta^{12}, \beta^{11}, \beta^{10}, \beta^9, \beta^8, \beta^7, \beta^6, \beta^5, \beta^4, \beta^3, \beta^2, \beta, 1)$, $\beta$ being the primitive element of GF($2^4$), $s_1=H_1 \cdot V$ and
$s_2=H_2 \cdot V$.

Since syndromes $s_1$ and $s_2$ show error positions, modulation code V is corrected to remove the 4-bit error correction detecting symbol to produce 9-bit data $W_1$ and $W_2$, which are then entered to the demodulating section 76.

The demodulating section 76 is provided with a first ROM table $76_1$ having an address of 9-bit data $W_1$ and adapted to output 8-bit demodulation data and a second ROM table $76_2$ having an address of $W_2$ and adapted to output 8-bit demodulation data. Each of the ROM tables $76_1$ and $76_2$ contains a total of 512 8-bit demodulation data.

The first ROM table $76_1$ stores demodulation data values that correspond to the 253 modulation codes of the first modulation table 90 respectively at the corresponding addresses. Then, one of the 3 demodulation data values (which represents dummy demodulation data to be used for detecting demodulation errors) that are not allocated to the first modulation table 90 is stored at the remaining 259 addresses. On the other hand, the second ROM table $76_2$ stores demodulation data values that correspond to the 3 modulation codes of the second modulation table 92 respectively at the corresponding addresses. Then, one of the 253 demodulated values obtained by putting aside the demodulation data corresponding to the 3 modulation codes selected from the second modulation table 92 (which represents dummy demodulation data to be used for detecting demodulation errors) is stored at the remaining 509 addresses.

The 9-bit data $W_1$, $W_2$ output respectively from the first error correction detecting section $74_1$ and the second error correction detecting section $74_2$ are then subjected to a demodulating operation conducted by referring to the above two demodulation tables (ROM tables $76_1$ and $76_2$) to generate demodulation data $F_1$ and $F_2$. Error detection flag $C_1$ from the first error correction detecting section $74_1$ and error detection flag $C_2$ from the second error correction detecting section $74_2$ are entered to the determining section $76_3$ along with the two demodulation data $F_1$, $F_2$, which determining section $76_3$ outputs a single demodulation data F and demodulation error identifying information C that corresponds to the demodulation data under the following conditions.

1) demodulation error identifying information C=1 and F=$F_1$ when
   $F_1 \in U_1$, $F_2 \in U_2$ and $C_1=C_2=0$,
2) demodulation error identifying information C=1 and F=$F_1$ when
   $F_1 \in U_1$, $F_2 \in U_2$ and $C_1=C_2=1$,
3) demodulation error identifying information C=0 and F=$F_1$ when
   $F_1 \in U_1$, $F_2 \in U_2$, $C_1=0$ and $C_2=1$,
4) demodulation error identifying information C=0 and F=$F_2$ when
   $F_1 \in U_1$, $F_2 \in U_2$, $C_1=1$ and $C_2=0$,
5) demodulation error identifying information C=0 and F=$F_1$ when
   $F_1 \in U_1$, $F_2 \in \underline{U}_2$ and $C_1=0$,
6) demodulation error identifying information C=1 and F=$F_1$ when
   $F_1 \in U_1$, $F_2 \in \underline{U}_2$ and $C_1=0$, 7) demodulation error identifying information C=0 and F=F$_2$ when
   F$_1$ ∈ U̲$_1$, F$_2$ ∈ U$_2$ and C$_2$=0,
8) demodulation error identifying information C=1 and F=F$_2$ when
   F$_1$ ∈ U̲$_1$, F$_2$ ∈ U$_2$ and C$_2$=1, and
9) demodulation error identifying information C=1 and F=F$_2$ when
   F$_1$ ∈ and F$_2$ ∈ U̲$_2$, where U$_1$ denotes a set of demodulation data corresponding to the 253 modulation codes selected from the first modulation table 90 and U$_2$ denotes a set of demodulation data corresponding to the 3 modulation codes selected from the second modulation table 92, whereas U̲$_1$ denotes a complementary set of U$_1$ and U̲$_2$ denotes a complementary set of U$_2$. When both C$_1$ and C$_2$ are equal to "1", then it indicates detection of an error. When both C$_1$ and C$_2$ are equal to "0" to the contrary, then it indicates that no detection of error. C denotes a demodulation error when it is equal to "1" and no modulation error when it is equal to "0".

The method for determining demodulation data F and demodulation error identifying information C that can be used for the purpose of the invention is not limited to the one as described above and, if there are two candidates for demodulation data F, the right one may be determined by weighting them with their respective error appearing probabilities that have been computed in advance for the given recording medium.

The demodulating section 76 operates to demodulate modulation codes by referring to demodulation tables and the number of reference addresses of the demodulation tables is reduced from 13 bits to 9 bits by removing the error correction checking symbol from each demodulation data in order to minimize the size of the demodulation tables in the above embodiment. However, it will be appreciated that the demodulating operation can be conducted by means of a logic circuit (which may include logical AND, OR and/or NOT circuits) without using a demodulation table. If such is the case, a data from which the error correction checking symbols is removed may devoid of information effective for logical operations and consequently a large circuit may be required to handle such data. Therefore, in this case, a 13-bit data is preferably sent directly to the logic circuit without removing the error correction checking symbols therefrom to output a 8-bit data.

Demodulation data F and demodulation error identifying information C are then entered to the deinterleaving section 78 and temporarily stored in an internal memory (not shown). When the demodulation data stored in the memory get to a predetermined volume that is based on the interleave-related information contained in the headers located in the respective positions determined by means of the macro block header distribution information, the stored pieces of demodulation data F and the corresponding pieces of demodulation error identifying information C are rearranged to generate an error correction code and a flag string indicating the positions for deletion.

The error correction code and the deleting position indicating flag string are then entered to the deleting/correcting section 80. The correction code is a Reed-Solomon code and the generating polynomial has roots of at α$^l$, α$^{l+1}$, ..., α$^{l+d-2}$ for primitive element α of GF($2^8$).

Since the procedure of deleting/correcting operation is not essential to the present invention, it will be described only briefly below.

Firstly, syndrome S$_{RS}$ is determined from multiplication of check matrix H$_{RS}$ and error correction code V$_{RS}$ and then expressed in the form of syndrome polynomial S$_{RS}$(x).

Then, deleting position polynomial λ(x) is determined from the deleting position indicating flag string to generate T$_{RS}$(x)=S$_{RS}$(x)λ(x).

Then, error position polynomial σ(x) and error pattern polynomial ω(x) are determined from T$_{RS}$(x) by means of the Euclidean algorithm. The roots of the determined error position polynomial σ(x) are then determined by the chain search technique to determine the error positions. Finally, an error position, an error pattern for the error position and a deletion pattern are produced from the roots of the error position polynomial σ(x), deleting position polynomial λ(x) and the error pattern polynomial ω(x).

The relationship among the smallest distance d of a error correction code, the number of errors L that can be corrected and the number of deletions P is expressed by the formula below.

$$2L+P \leq d-1$$

The use of deleting/correcting operation can improve the error correcting capability if compared with a case where no deletion is used. Particularly, if all the error in a correction code are attributable to deletion, the correcting capability is doubled from the case where all error positions are indefinite.

The compressed data obtained after the above described deleting/correcting operation are then entered to the compressed data decoding section 82, which decodes the compressed data by following a predetermined procedure to restore the original voice data. The restored voice data are then entered to the data reproducing section 62, which carries out an N-times over-sampling operation, a low-pass filtering operation and an operation of D/A conversion on the entered voice data before they are sent to an amplifier.

For the above described operation of reading an optically readable code pattern of modulation codes produced by means of the above described modulating method, a relatively rigorous modulation rule (for minimizing the number of consecutive black dots) can be used to extract modulation codes within a block without detecting wrong markers and a predetermined number of errors that can occur in any of the modulation codes can be reliably corrected or detected in the demodulating step so that any demodulation data having a detected demodulation error can be deleted or corrected in a subsequent step to minimize the overall data error rate and make it possible to use a recording medium that inherently has a high error rate.

[4th Embodiment]

Now, a modulation method and a modulator according to the invention will be described by referring to the fourth embodiment.

Figure 10:
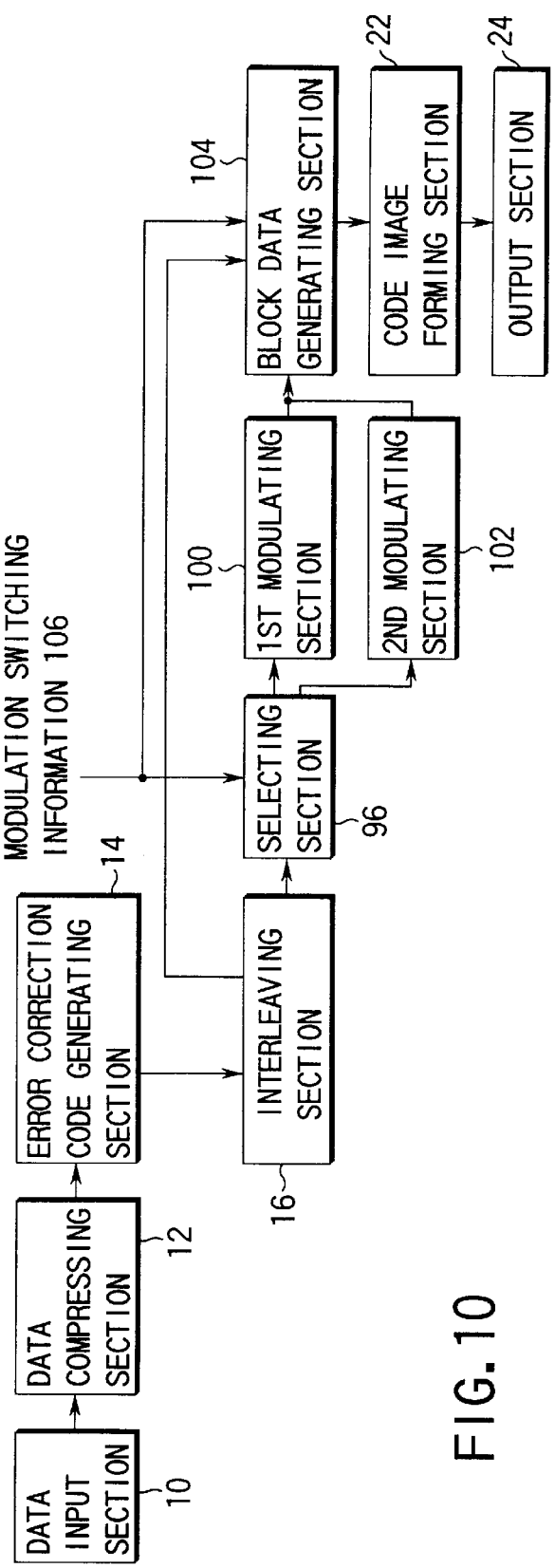
FIG. 10 is a schematic block diagram of a fourth embodiment of the invention.

FIG. 10 is a schematic block diagram of a dot code recording apparatus to which the fourth embodiment of modulation method and modulator according to the invention are applied. The dot code recording apparatus comprises a data input section 10, a data compressing section 12, an error correction code generating section 14, an interleaving section 16, a selecting section 96, a first modulating section 100, a second modulating section 102, a block data generating section 104, a code image forming section 22 and an output section 24.

The data input section 10 is used to input multimedia information in the form of a combination of voice, image and text and transform them into digital data. The data compressing section 12 operates to compress the digital data produced from the data input section 10 by transforming the input data in a predetermined manner. The error correction code generating section 14 adds an error correction checking symbol to the data compressed by the data compressing section 12 and generates error correction codes for the data. The interleaving section 16 performs an interleaving operation for the error correction code generated by the error correction code generating section 14.

The selecting section 96 selects either the first modulating section 100 or the second modulating section 102 according to modulation switching information 106 and feeds it with the data interleaved by the interleaving section 16. The first modulating section 100 and the second modulating section 102, whichever appropriate, converts the data fed to it into modulation codes (as will be described in greater detail hereinafter). The block data generating section 104 collects the modulation switching information 106 and a predetermined number of modulation codes to form a block and generates and adds a header to the block to produce block data.

The code image forming section 22 generates image data in the form of a code pattern 26 of dot codes as shown in FIG. 2 from the data of the block generated by the block data generating section 104. In other words, it transforms the block data into black and white dots in block header 28 and block user data 30 regions for the code pattern 26 of dot codes and generates image data out of them that are accompanied by markers 32 and pattern codes 34. Finally, the output section 24 outputs the image data of the code pattern 26 generated by the code image forming section 22 to a printer or some other recording device.

In the following description, voice is used for input data and any error correction code is a Reed-Solomon code. Additionally, the output code image will be a bit map image of an optically readable code pattern 26 as shown in FIG. 2 that comprises markers, a pattern code and markers, although the present invention is not limited thereto in any means.

Now, the operation of the first embodiment will be described also by referring to FIG. 11.

Firstly, voice information entered by way of a microphone (not shown) is subjected to A/D conversion and transformed into digital voice in the data input section 10.

The digital voice obtained by the transformation is then subjected to a data compressing operation of waveform coding such as ADPCM or of analytic/synthetic coding such as CELP. Additionally, identification data for identifying (the data type, the compression ratio and mode, the data volume, etc. of) the input data and the data compressing operation are added as header to the compressed voice data, which are then sent into the error correction code generating section 14.

Then, an error correction code checking symbol is added to every predetermined number of bytes of the compressed voice data entered to the error correction code generating section 14. Any error correction code checking symbol as used herein is a Reed-Solomon code checking symbol. For example, an error correction code checking symbol of 16 bytes may be added to every 72 bytes of data. The Reed-Solomon code generating polynomial as used in this embodiment has roots of $\alpha^l, \alpha^{l+1}, \ldots, \alpha^{l+d-2}$ for primitive element $\alpha$ on Galois field $GF(2^8)$, where d represents the smallest Hamming distance and 1 represents a positive integer equal to or smaller than 254−(d−2), which may be equal to zero.

Then, a plurality of 88 bytes Reed-Solomon codes, each having a checking symbol, are entered to the interleaving section 16.

The plurality of Reed-Solomon codes entered to the interleaving section 16 are temporarily stored in an internal memory (not shown). Then, the stored data are interleaved when a predetermined number of Reed-Solomon codes are accumulated there or according to the accumulated number of codes so that they can readily be used to cope with burst errors. The interleaving method and the format of correction code are described the header (which is a macro block header as described in EP 0 713 194 A1 (corresponding to U.S. Ser. No. 08/586,792, now issued as U.S. Pat. No. 5,898,709) proposed by the applicant of the present patent application). The header is then inserted into and added to the interleaved data in a distributed manner according to the volume of the data stored in the memory. A description of the rule for the distribution and the insertion (macro block header distribution information) is then entered to the block data generating section 104 and recorded in the block header 28 as will be described hereinafter. The interleaved data and header are modulated by every unit of bytes for the above error correction and then input to the selecting section 96 (although a byte unit of a Reed-Solomon code corresponds to 8 bits in this embodiment, it does not necessarily have to do so long as it is equal to a data unit to be modulated (as will be described hereinafter)).

Each byte data entered to the selecting section 96 is the sent either the first modulating section 100 or the second modulating section 102 according to the modulation switching information 106. The modulation switching information 106 will be selected according to the recording medium selected by the code pattern producer or determined automatically or manually (by means of a table providing correspondence between recording media and the types of modulation) at the time of selecting the recording medium.

The reason for selecting the type of modulation lies in the difference of error rate among various recording media. Priority will be given to the error correcting capability by selecting modulation codes appropriate for a recording medium having a high error rate. On the other hand, priority will be given to the code size by selecting modulation codes that have no error correcting capability but show a short code length.

The byte data produced from the selecting section 96 are then entered to the block data generating section 104 as modulation codes that correspond to the addresses of a modulation table ROM (not shown) arranged in either the first modulating section 100 or the second modulating section 102. Note that the first modulating section 100 has a modulation table that is used when the recording medium shows a low error rate, whereas the second modulating section 102 has a modulation table that is used when the recording medium shows a high error rate.

The contents of the modulation tables will be described by referring to FIG. 2 showing a modulation rule for an optically readable cord pattern 26 printed on a sheet of paper as in the case of the first embodiment.

The modulation table of the first modulating section 100 contains a group of modulation codes that do not give rise to a pattern same as that of any of the markers 32 in the block user data 30. The modulation rule provides that there shall be two or less consecutive black dots arranged in the direction parallel to that of the pattern codes 34 as described in EP 0 765 041 A2 (corresponding to U.S. Ser. No. 08/696,003, now issued as U.S. Pat. No. 5,825,309) filed by the applicant of the present patent application, although the number of consecutive black dots that can be permitted by the rule depends of the size of the markers 32 that operate as reference indexes and hence is not invariable in any means. In this example, a 1-byte data (8 bits=N) is converted into a 10-bit modulation code (=$M_0+K_0$; $M_0=10$, $K_0=0$).

The modulation table of the second modulating section 102 contains modulation codes that are capable of correcting bit errors as described earlier by referring to the first embodiment. Then, the maximum permissible number of consecutive black dots in the direction of the pattern codes 34 is four. The modulation table of the second modulating section 102 may alternatively contain modulation codes capable of correcting bit errors as described above by referring to the third embodiment. Then, the maximum permissible number of consecutive black dots in the direction of the pattern codes 34 is three. In the example, a 1-byte data (8 bits=N) is converted into a 13-bit modulation code (=$M_1+K_1$; $M_1=9$, $K_1=4$).

The modulation codes modulated by the first modulating section 100 of the second modulating section 102 are then entered to the block data generating section 104 and collected for the number equal to the number of recordable modulation codes of the block user data 30 in the code pattern 26 shown in FIG. 2 to produce block user data information. Additionally, a block address, the above described macro bock header distributing information sent from the interleaving section 16 and the modulation switching information 106 are arranged at respective predetermined bit positions of each piece of the block user data information and an error correction code checking symbol (a BCH code checking symbol) is added thereto to generate block header information. Then, block data containing block header information and user data information as a unit will be generated.

The above block data are then entered to the code image forming section 22 to produce a bit map A image of the code pattern 26. More specifically, each of the bits used for the block header information is transformed for the corresponding black or white dot of the block header 28, while each of the above 13 bits is transformed for the corresponding black or white dot image in the block user data 30. Note that a bit is transformed into a black dot if it is equal to "1", whereas it is transformed into a white dot if it is equal to "0". Also note that white dots will not have to be printed at all.

The block user data are arranged from the block 36 at the upper left corner and in parallel with the pattern codes 34. Then, marker 32 and pattern code 34 are added to the predetermined respective positions of the block by the code image forming section 22 to produce a complete block. In the code pattern 26, each block shares regions for marker 32, pattern code 34 and block headers 28 with adjacently located blocks.

In particular, the block header 28 is provided with a modulation switching flag 108 that corresponds to the modulation switching information 106 and is used to identify the modulation method in the block user data 30. A modulation switching flag 108 is arranged in the block header 28 because it can be placed at a position that does not require any modulation and is read before the block user data 30.

While the numbers of bits of the modulation codes of the two different types (=R) of this embodiment are 10 (=$M_0+K_0$; $M_0=10$, $K_0=0$) and 13 (=$M_1+K_1$; $M_1=9$, $K_1=4$) as shown above, the numbers of dots of the block user data regions are preferably a number that is divisible by the number of bits of the respective modulation codes. If either of them is not divisible, dummy data have to be introduced to the tail of the block user data region so that the head of the block user data agrees with a partition of the modulation codes for sure. With this arrangement, the advantage of a code pattern 26 having a block structure for allowing a random reading operation on a block by block basis is maintained.

Figure 4:
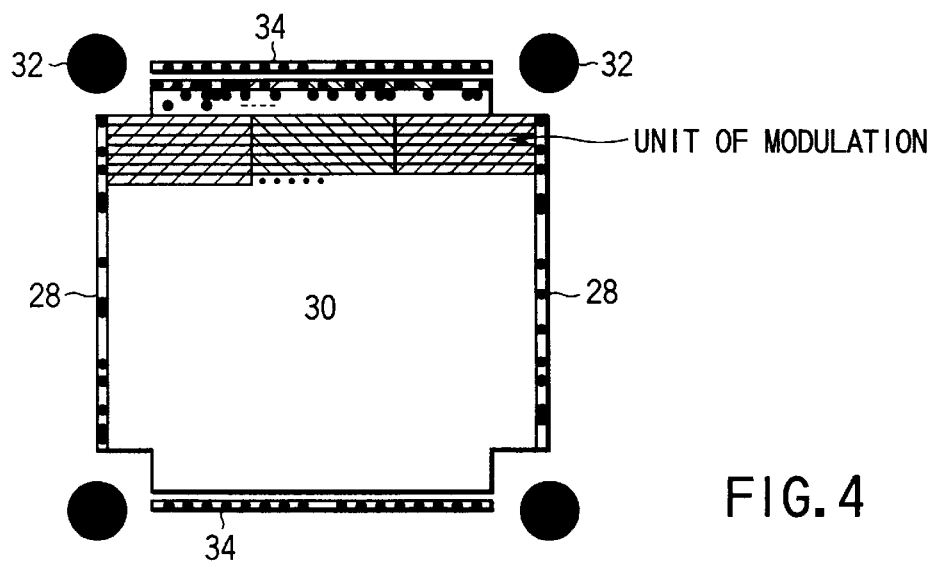
FIG. 4 is a schematic illustration of the physical format of the blocks that constitute a code pattern to be used for the first embodiment.

Additionally, by providing a dot recording prohibiting region 110 having a width equal to the size of a dot between the block header 28 and the block user data 30 as shown in FIG. 12, the number of consecutive black dots over two adjacent blocks can be limited to a predetermined value without making the boundary of the block header 28 and the block user data 30 agree with a partition for modulation codes as shown in FIG. 4 for either of the two type of modulation code. Such a dot prohibiting region 110 is effective not only for this embodiment but also for any embodiments that use only a single type of modulation code and do not require switching from one type to another and those that use more than two types of modulation code.

While the logical structure of the block header 28 and the block user data 30 is not described in detail above, it may preferably be identical with the one described in EP 0 713 194 A1 (corresponding to U.S. Ser. No. 08/586,792, now issued as U.S. Pat. No. 5,989,709).

The bit map image of the generated code pattern 26 is then transmitted to the output section 24, which transforms it into data that can be recognized by a printing press or a printer and outputs them to the latter.

Thus, with this embodiment, the modulation codes generated by either of the two modulation techniques can be recorded on an optically readable recording medium in the form of a code pattern without the risk of reading wrong markers and the error correction capability or the area occupied by the code pattern can be determined as a function of the error rate of the recording medium to optimize the recording efficiency.

[5th Embodiment]

Now, a demodulation method and a demodulator according to the invention will be described by referring to the fifth embodiment.

Figure 13:
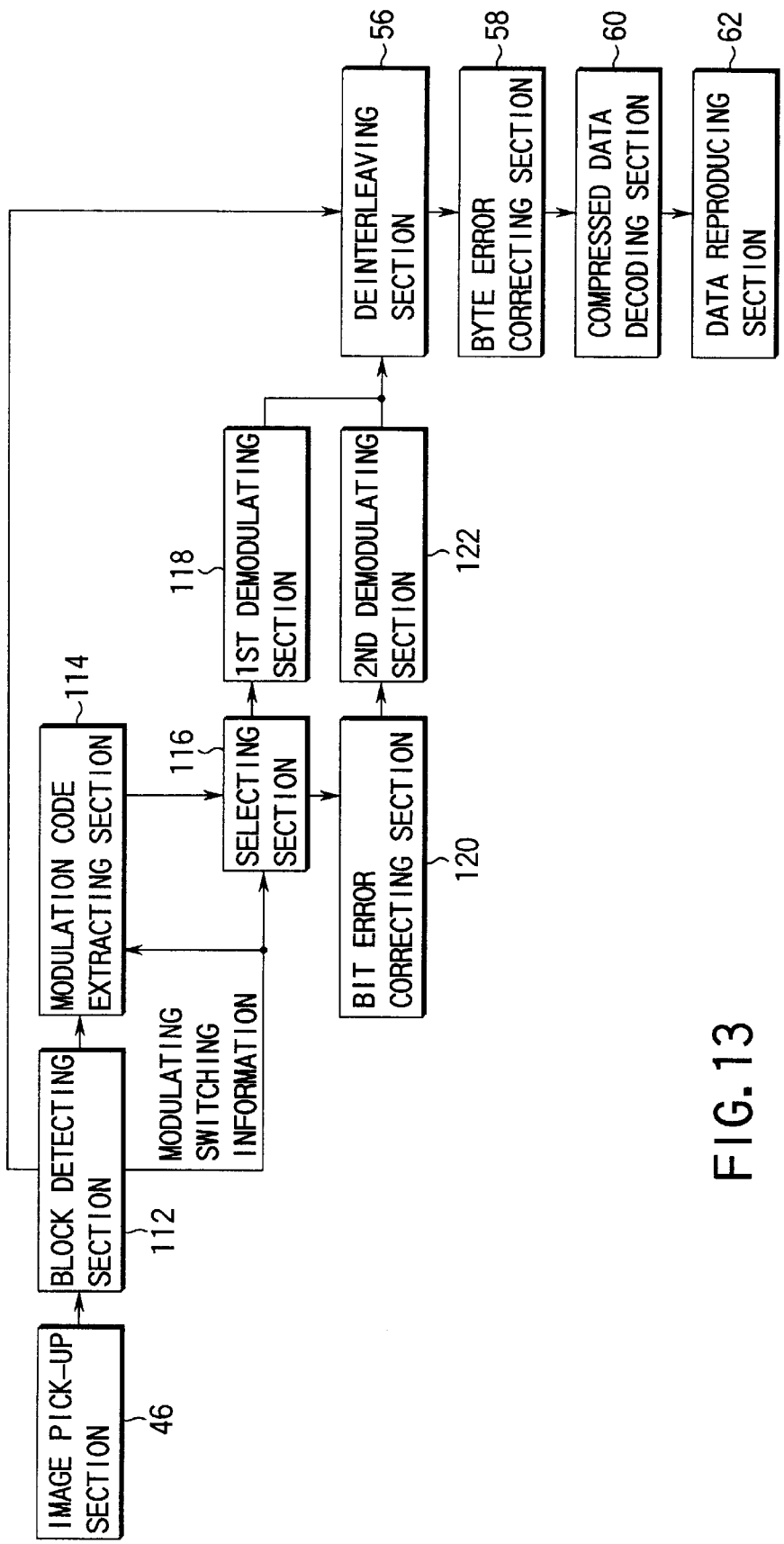
FIG. 13 is a schematic block diagram of the fifth embodiment of the invention.

FIG. 13 is a schematic block diagram of a dot code reproducing apparatus to which the fifth embodiment of demodulation method and demodulator according to the invention are applied. The dot code reproducing apparatus comprises an image pick-up section 46, a block detecting section 112, a modulation code extracting section 114, a selecting section 116, a first demodulating section 118, a bit error correcting section 120, a second demodulating section 122, a deinterleaving section 56, a byte error correcting section 58, a compressed data decoding section 60 and a data reproducing section 62.

The image pick-up section 46 picks up an optically readable code pattern and generates a digital image. The block detecting section 112 detects blocks of dot codes from the generated digital image and extracts the black header of each of the detected blocks. The modulation code extracting section 114 extracts modulation codes from the block user data and feeds the modulation switching information of the block header to the modulation code extracting section 114 and the selecting section 116.

The modulation code extracting section 114 extracts modulation codes from the block user data in the block extracted by the block detecting section 112 according to the modulation switching information of the block header. The selecting section 116 assigns the modulation codes extracted by the modulation code extracting section 114 either to the first demodulating section 118 or to the bit error correcting section 120 according to the modulation switching information. The first demodulating section 118 generates demodulation data for the modulation codes assigned to it by the selecting section 116. The bit error correcting section 120 corrects bit errors in the modulation codes assigned to it by the selecting section 116 and the second demodulating section 122 generates demodulation data for the modulation codes that have been corrected for bit errors.

The deinterleaving section 56 temporarily stores the demodulation data generated by the first demodulating section 118 or the second demodulating section 122 in an internal memory (not shown) and rearranges the plurality of pieces of demodulation data stored in the memory. The byte error correcting section 58 performs a byte error correcting operation on the rearranged pieces of demodulation data and the compressed data decoding section 60 decodes the compressed data that have been corrected for byte errors by decompressing them to restore the original multimedia data in the form of a combination of voice, image and text. The data reproducing section 62 transforms the restored multimedia data into data that can be recognized by an output unit (not shown) and sends them to the output unit.

While it is assumed here that the code pattern has a configuration as shown in FIG. 2, whereas the operation of byte error correction is an operation of correcting Reed-Solomon codes and data are output as voice data, it should be noted that the present invention is not limited thereto in any means.

Now, the operation of the fifth embodiment will be described in detail.

The image pick-up section 46 picks up an image of the code pattern 26 typically by means of a CCD camera and binarizes it to produce a binarized image.

The produced binarized image is then entered to the block detecting section 112, which detects blocks 36 from the entered binarized image and determines the positions for reading the block header 28 and the block user data 30. Then, the block address and the macro block header distribution information contained in the block header 28 read out at the determined reading position are transmitted to the deinterleaving section 56, while the modulation switching information is transmitted to the modulation code extracting section 114 and the selecting section 116. The logical structure of the block address and that of the macro block header distribution information are described in detail in EP 0 713 194 A1 (corresponding to U.S. Ser. No. 08/586,792) filed by the applicant of the present patent application and hence will not be described here.

The modulation code extracting section 114 determines each of the bits read out at the position for reading the block user data for black or white dot and transforms them into bit data in order to extract 10- or 13-bit modulation codes according to the bit map image switching information.

Means for demodulating 10-bit modulation codes are described in EP 0 765 041 A2 (corresponding to U.S. Ser. No. 08/696,003, now issued as U.S. Pat. No. 5,825,309) filed by the applicant of the present patent application and means for demodulating 13-bit modulation codes are described earlier by referring to the second embodiment.

The selecting section 116 receives the modulation switching information from the block detecting section 112 and the modulation codes from the modulation code extracting section 114. The selection section 116 sends the modulation codes to the first demodulating section when the unequivocally defined modulation switching information indicates 13-bit modulation codes (flag "0") and to the bit error correcting section 120 when the modulation switching information indicates 13-bit modulation codes (flag "1").

The 13-bit modulation codes subjected to a bit error correcting operation in the bit error correcting section 120 are entered to the second demodulating section 122.

10-bit modulation codes are demodulated to 8-bit demodulation data in the first demodulating section 118, whereas 13-bit modulation codes are demodulated to 8-bit demodulation data in the second demodulating section 122 before they are sent to the deinterleaving section 56.

The deinterleaving section 56 and the sections located further downstream operate exactly in a manner as described by referring to the second embodiment and hence will not be described here any further.

Thus, with this embodiment, the modulation codes generated by either of the two modulation techniques can be recorded on an optically readable recording medium in the form of a code pattern without the risk of reading wrong markers and modulation codes of a specific type can be identified and extracted out of those of a plurality of different types as a function of the error rate of the recording medium. Additionally, when modulation codes are used for a recording medium showing a high error rate, a predetermined number of errors generated in the modulation codes can be corrected in the demodulation step so that, when combined with the byte error correcting operation in a subsequent step, the overall error rate of the data on the recording medium can be remarkably minimized.

Finally, while the modulation rule is provided solely in terms of the number of consecutive black dots to reliably identify markers operating as reference indexes in the above first through fifth embodiments, a modulation rule prohibiting the generation of same black and white patterns for markers 124 operating as reference indexes as shown in FIG. 14 may alternatively be used. Still alternatively, a modulation rule adapted to identify other reading reference patterns (rectangular patterns, linear patterns or synchronous clock patterns using dotted lines) that operates as reference index may also be used.

For the purpose of the invention, the modulation rule is not limited to providing a limit to the number of consecutive black dots or exclusion of specific white and black patterns and may provide, for example, exclusion of DC components in a manner as popularly practiced for magnetic recording.

While the invention is described above by referring to preferred embodiments, it should be understood that the present invention is not limited to those embodiments in any means, which may be modified in various different ways without departing from the spirit and the scope of the invention. The present invention can be summarily described as follows.

(1) A method of modulating digital data to be used for transmitting or recording N-bit data, characterized by comprising steps of:

inputting an N-bit data;

converting the input N-bit data into an M+K-bit data (44) selected out of a group of $2^M$ M+K-bit data (42) according to a predetermined rule, the group of $2^M$ M+K-bit data (42) being obtained by adding a K-bit error correction checking symbol (40) to M-bit data (N<M) (38); and outputting the converted M+K-bit data.

With this arrangement, since an error correction checking symbol is added to the modulated digital data (modulation codes) and the obtained data conforms to a predetermined modulation rule providing the adaptability to the related transmission or recording apparatus, the transmitted or recorded modulation data can be reliably extracted by a receiving or reproducing unit, whichever appropriate, and a predetermined number of errors can be corrected and detected in a simple and reliable manner out of the errors generated at the time of reading modulation codes. Thus, the error rate of the input data to be subjected to an error correcting operation after the demodulation by a receiving or reproducing apparatus can be reduced to consequently reduce the overall error rate and hence make the use of a transmission and recording medium show a relatively high error rate feasible.

(2) A method of modulating digital data to be used for transmitting or recording N-bit data, characterized by comprising steps of:

inputting an N-bit data;

converting the input N-bit data into an M+K-bit data selected out of a group of $L \times 2^M$ M+K-bit data (86, 88) according to a predetermined rule, the group of $L \times 2^M$ M+K-bit data (86, 88) being obtained by adding K-bit error correction checking symbols generated on the basis of L error correcting generation polynomials to M-bit data (N<M) (84) on a one by one basis and in terms of Hamming distance greater than a predetermined value; and outputting the converted M+K-bit data.

With this arrangement, since modulation codes are selected from a group of bit data having respective error correction checking symbols originating from different generation polynomials, a modulation rule that provides an enhanced level of adaptability to the related transmission or recording apparatus can be used. Additionally, the transmitted or recorded modulation data can be reliably extracted by a receiving or reproducing apparatus, whichever appropriate, and a predetermined number of errors can be corrected and detected in a simple and reliable manner out of the errors generated at the time of reading modulation codes. Thus, the error rate of the input data to be subjected to an error correcting operation after the demodulation by a receiving or reproducing apparatus can be reduced to consequently reduce the overall error rate and hence make the use of a transmission and recording medium show a relatively high error rate feasible.

(3) A method of modulating digital data to be used for transmitting or recording N-bit data, characterized by comprising steps of:

inputting an N-bit data;

converting by means of a converting method selected out of R different converting methods the input N-bit data into an $M_i+K_i$-bit data selected out of a group of $2^{Mi}$ $M_i+K_i$-bit data according to a predetermined rule, the group of $2^{Mi}$ $M_i+K_i$-bit data being obtained by adding $K_i$-bit error correction checking symbols ($K_i$ being 0 or a positive integer) to $M_i$-bit data (N<M; i=0, 1, 2, 3, . . . , R−1) on a one by one basis; and outputting the converted M+K-bit data along with information data (106) showing the selected converting method.

With this arrangement, since error correction checking symbols with different error correction capabilities are used to produce a plurality of groups of modulation codes according a predetermined modulation rule, it is possible to select a modulation code conforming to the predetermined modulation rule that provides adaptability to the related transmission or recording apparatus, taking the error rate into consideration. The efficiency of transmission or recording can be improved by selecting a modulation code as a function of the error rate of the transmission or recording medium and the receiving or reproducing apparatus can reliably extract the modulation code. Thus, the error rate of the input data to be subjected to an error correcting operation after the demodulation by a receiving or reproducing apparatus can be reduced to consequently reduce the overall error rate.

(4) The method of modulating digital data according to one of (1), (2) and (3), characterized in that the predetermined rule includes one of a rule that the number of consecutive bits of at least one of "1"s and "0"s of the modulated digital data shall be less than the largest number of consecutive bits of the at least one of "1"s and "0"s constituting the reference index (32) contained in the digital data to be transmitted or recorded and a rule that the predetermined pattern of "1"s and "0"s of the modulated digital data shall not contain the predetermined pattern of "1"s and "0"s constituting the reference indexes (124) contained in the digital data to be transmitted or recorded.

With this arrangement, a less rigorous limit can be imposed on the number of selectable modulation codes and modulation codes can be extracted more reliably at the time of reception or reproduction to reduce the number of errors that can be appear at the time of reading modulation codes if compared with the use of modulation codes adapted to remove DC components because the modulation rule provides only discrimination of modulation codes and reference indexes (markers).

(5) The method of modulating digital data according to one of (1), (2) and (3), characterized in that, if the digital data to be transmitted or recorded comprises a section (28, 30) to be modulated and a section (34) not to be modulated that are located adjacent to each other, the predetermined rule includes one of a rule that the number of consecutive bits of at least one of "1"s and "0"s of the modulated digital data shall be less than the largest number of consecutive bits of the at least one of "1"s and "0"s constituting the reference index (32) contained in the digital data to be transmitted or recorded in a region where the section to be modulated adjoins the section not to be modulated and a rule that the predetermined pattern of "1"s and "0"s of the modulated digital data shall not contain the predetermined pattern of "1"s and "0"s constituting the reference indexes (124) contained in the digital data to be transmitted or recorded in a region where the section to be modulated adjoins the section not to be modulated.

With this arrangement, a less rigorous limit can be imposed on the number of selectable modulation codes and modulation codes can be extracted more reliably at the time of reception or reproduction to reduce the number of errors that can be appear at the time of reading modulation codes if compared with the use of modulation codes adapted to remove DC components because the modulation rule provides only discrimination of modulation codes and reference indexes (markers), taking into consideration the section not to be modulated that is located adjacent to the section to be modulated into consideration.

(6) The method of modulating digital data according to one of (1), (2), (3), (4) and (5), characterized in that the N-bit data is a data that corresponds to a 1-byte data at the time of byte error correction coding to be conducted prior to the modulation.

With this arrangement, a byte of a byte error correction code is made to correspond to a modulation code without increasing the number of byte errors for wrong corrections that can take place in a demodulation error correcting operation at the time of reception or reproduction (error correcting operation on modulation codes). Thus, the byte error rate can reliably be reduced in the demodulation error correcting operation to effectively carry out a byte error correcting operation after demodulation.

(7) A method of demodulating an M+K-bit digital data obtained by a digital data modulating method of converting N-bit data into an M+K-bit data selected out of a group of $2^M$ M+K-bit data according to a predetermined rule, the group of $2^M$ M+K-bit data being obtained by adding a K-bit error correction checking symbol to M-bit data (N<M), back into N-bit data, characterized by comprising steps of:

carrying out at least one of an error correcting operation and an error detecting operation on the M+K-bit data (64); and demodulating the M+K-bit data (66) subjected to the at least one of the error correcting operation and the error detecting operation into N-bit data (72).

With this arrangement, demodulation errors can be reduced or detected by carrying out an error correcting operation or an error detecting operation on the modulation code to which an error correction checking symbol is added. The detected demodulation errors can be utilized as deletion flags for the error correcting operation to be conducted after modulation to carry out the deleting and correcting operation so that the demodulation errors are reduced or detected to maximize the error correcting capability for correcting errors after demodulation.

(8) The method of demodulating digital data according to (7), characterized in that the step of demodulating includes steps of:

extracting only the M-bit data (68) from the M+K-bit data (66) that has been subjected to the at least one of the error correcting operation and the error detecting operation by removing the K-bit error correction checking symbol; and demodulating the extracted M-bit data (68) into an N-bit data (72).

With this arrangement, demodulation errors can be reduced or detected by carrying out an error correcting operation or an error detecting operation on the modulation codes to which an error correction checking symbol is added. Additionally, a small demodulation can be used because the error correction checking symbol is removed from the modulation code that has been subjected to an error correcting operation or an error detecting operation before demodulation. The detected demodulation errors can be utilized as deletion flags for the error correcting operation to be conducted after modulation to carry out the deleting and correcting operation so that the demodulation errors are reduced or detected to maximize the error correcting capability for correcting errors after demodulation.

(9) A method of demodulating an M+K-bit digital data obtained by a digital data modulating method of converting the input N-bit into an M+K-bit data selected out of a group of $L \times 2^M$ M+K-bit data according to a predetermined rule, the group of $L \times 2^M$ M+K-bit data being obtained by adding K-bit error correction checking symbols generated on the basis of L error correcting generation polynomials to M-bit data (N<M) on a one by one basis and in terms of Hamming distance greater than a predetermined value, into an N-bit data, characterized by comprising steps of:

carrying out one of an error correcting operation and an error detecting operation on the M+K-bit data corresponding to each of the L error correction generation polynomials;

demodulating the L M+K-bit data subjected to the one of the error correcting operation and the error detecting operation into L N-bit data; and selecting the most likely N-bit data out of the demodulated L N-bit data and outputting it with the demodulation error identifying information corresponding to the selected N-bit data.

With this arrangement, demodulation errors can be reduced or detected by carrying out an error correcting operation or an error detecting operation on the modulation code to which an error correction checking symbol is added. The detected demodulation errors can be utilized as deletion flags for the error correcting operation to be conducted after modulation to carry out the deleting and correcting operation so that the demodulation errors are reduced or detected to maximize the error correcting capability for correcting errors after demodulation.

(10) The method of demodulating digital data according to (9), characterized in that the step of demodulating includes steps of:

extracting only the L M-bit data from the L M+K-bit data that has been subjected to the one of the error correcting operation and the error detecting operation by removing the respective K-bit error correction checking symbols; and demodulating the extracted L M-bit data into L N-bit data.

With this arrangement, demodulation errors can be reduced or detected by carrying out an error correcting operation or an error detecting operation on the modulation codes to which an error correction checking symbol is added. Additionally, a small demodulation can be used because the error correction checking symbol is removed from the modulation code that has been subjected to an error correcting operation or an error detecting operation before demodulation. The detected demodulation errors can be utilized as deletion flags for the error correcting operation to be conducted after modulation to carry out the deleting and correcting operation so that the demodulation errors are reduced or detected to maximize the error correcting capability for correcting errors after demodulation.

(11) A method of demodulating an $M_i+K_i$-bit digital data obtained by a digital data modulating method of converting by means of a converting method selected out of R different converting methods the input N-bit into an $M_i+K_i$-bit data selected out of a group of $2^{Mi}$ $M_i+K_i$-bit data according to a predetermined rule, the group of $2^{Mi}$ $M_i+K_i$-bit data being obtained by adding $K_i$-bit error correction checking symbols ($K_i$ being 0 or a positive integer) to $M_i$-bit data (N<M; i=0, 1, 2, 3, . . . , R−1) on a one by one basis, the digital data modulating method including a step of outputting the obtained $M_i+K_i$-bit digital data along with information data showing the selected converting method, into an N-bit data, characterized by comprising steps of:

extracting the information data showing the selected converting method;

extracting the $M_i+K_i$-bit data according to the extracted information data; and demodulating the extracted $M_i+K_i$-bit data into an N-bit data according to the extracted information data.

With this arrangement, the information describing the type of the modulation code selected according to the characteristics of the transmission or recording medium is extracted prior to demodulation so that the type of modulation code can be determined without requiring a complicated process and hence the modulation code can be extracted and demodulated reliably according to the type of the modulation code.

(12) The method of demodulating digital data according to (11), characterized by further comprising step of conducting one of an error correcting operation and an error detecting operation on the extracted $M_i+K_i$-bit data when the $K_i$ determined unequivocally from the extracted information data is not equal to 0, and characterized in that the step of demodulating includes a step of demodulating the $M_i+K_i$-bit data that has been subjected to the one of the error correcting operation and the error detecting operation into an N-bit data.

With this arrangement, demodulation errors can be reduced and detected by carrying out an error correcting operation or an error detecting operation on the modulation codes of a plurality of different types to which an error correction checking symbol is added. The detected demodulation errors can be utilized as deletion flags for the error correcting operation to be conducted after modulation to carry out the deleting and correcting operation so that the demodulation errors are reduced or detected to maximize the error correcting capability for correcting errors after demodulation.

(13) The method of demodulating digital data according to (11), characterized by further comprising step of conducting one of an error correcting operation and an error detecting operation on the extracted $M_i+K_i$-bit data when the $K_i$ determined unequivocally from the extracted information data is not equal to 0, and characterized in that the step of demodulating includes steps of:

extracting only the $M_i$-bit data from the $M_i+K_i$-bit data that has been subjected to the one of the error correcting operation and the error detecting operation by removing the $K_i$-bit error correcting checking symbol; and demodulating the extracted $M_i$-bit data into an N-bit data.

With this arrangement, demodulation errors can be reduced or detected by carrying out an error correcting operation or an error detecting operation on the modulation codes of a plurality of different types to which an error correction checking symbol is added. Additionally, a small demodulation can be used because the error correction checking symbol is removed from the modulation code that has been subjected to an error correcting operation or an error detecting operation before demodulation. The detected demodulation errors can be utilized as deletion flags for the error correcting operation to be conducted after modulation to carry out the deleting and correcting operation so that the demodulation errors are reduced or detected to maximize the error correcting capability for correcting errors after demodulation.

(14) The method of demodulating digital data according to one of (7), (8), (9), (10), (11), (12) and (13), characterized in that the N-bit data is a data that corresponds to a 1-byte data at the time of byte error correction decoding to be conducted subsequent to the demodulation.

With this arrangement, a byte of a byte error correction code is made to correspond to a modulation code without increasing the number of byte errors for wrong corrections that can take place in a demodulation error correcting operation at the side of the receiving or reproducing apparatus. Thus, the byte error rate can reliably be reduced in the demodulation error correcting operation to effectively carry out a byte error correcting operation after demodulation.

(15) A digital data modulator to be used for transmitting or recording N-bit data, characterized by comprising:

an input terminal for inputting an N-bit data;

a converting section (modulation table) for converting the input N-bit data into an M+K-bit data (44) selected out of a group of $2^M$ M+K-bit data according to a predetermined rule, the group of $2^M$ M+K-bit data being obtained by adding a K-bit error correction checking symbol (40) to M-bit data (N<M) (38); and an output terminal for outputting the converted M+K-bit data.

With this arrangement, since an error correction checking symbol is added to the modulated digital data (modulation codes) and the obtained data conforms to a predetermined modulation rule providing the adaptability to the related transmission or recording apparatus, the transmitted or recorded modulation data can be reliably extracted by a receiving or reproducing apparatus, whichever appropriate, and a predetermined number of errors can be corrected and detected in a simple and reliable manner out of the errors generated at the time of reading modulation codes. Thus, the error rate of the input data to be subjected to an error correcting operation after the demodulation by a receiving or reproducing apparatus can be reduced to consequently reduce the overall error rate and hence make the use of a transmission and recording medium show a relatively high error rate feasible.

(16) A digital data modulator to be used for transmitting or recording N-bit data, characterized by comprising:

an input terminal for inputting an N-bit data;

a converting section for converting the input N-bit data into an M+K-bit data selected out of a group of $L \times 2^M$ M+K-bit data (86, 88) according to a predetermined rule, the group of $L \times 2^M$ M+K-bit data being obtained by adding K-bit error correction checking symbols generated on the basis of L error correcting generation polynomials to M-bit data (N<M) (84) on a one by one basis and in terms of Hamming distance greater than a predetermined value; and an output terminal for outputting the converted M+K-bit data.

With this arrangement, since modulation codes are selected from a group of bit data having respective error correction checking symbols originating from different generation polynomials, a modulation rule that provides an enhanced level of adaptability to the related transmission or recording apparatus can be used. Additionally, the transmitted or recorded modulation data can be reliably extracted by a receiving or reproducing apparatus, whichever appropriate, and a predetermined number of errors can be corrected and detected in a simple and reliable manner out of the errors generated at the time of reading modulation codes. Thus, the error rate of the input data to be subjected to an error correcting operation after the demodulation by a receiving or reproducing apparatus can be reduced to consequently reduce the overall error rate and hence make the use of a transmission and recording medium show a relatively high error rate feasible.

(17) A digital data modulator to be used for transmitting or recording N-bit data, characterized by comprising:

an input terminal for inputting an N-bit data;

a converting section for converting by means of a converting method selected out of R different converting methods the input N-bit data into an $M_i+K_i$-bit data selected out of a group of $2^{M_i}$ $M_i+K_i$-bit data according to a predetermined rule, the group of $2^{M_i}$ $M_i+K_i$-bit data being obtained by adding $K_i$-bit error correction checking symbols ($K_i$=0, 1, 2, 3, . . . ) to $M_i$-bit data (N<M; i=0, 1, 2, 3, . . . , R−1) on a one by one basis; and an output terminal for outputting the converted M+K-bit data along with information data (106) showing the selected converting method.

With this arrangement, since error correction checking symbols with different error correction capabilities are used to produce a plurality of groups of modulation codes according a predetermined modulation rule, it is possible to select a modulation code conforming to the predetermined modulation rule that provides adaptability to the related transmission or recording apparatus, taking the error rate into consideration. The efficiency of transmission or recording can be improved by selecting a modulation code as a function of the error rate of the transmission or recording medium and the receiving or reproducing apparatus can reliably extract the modulation code. Thus, the error rate of the input data to be subjected to an error correcting operation after the demodulation by a receiving or reproducing apparatus can be reduced to consequently reduce the overall error rate.

(18) The digital data modulator according to one of (15), (16) and (17), characterized in that the predetermined rule includes one of a rule that the number of consecutive bits of at least one of "1"s and "0"s of the modulated digital data shall be less than the largest number of consecutive bits of the at least one of "1"s and "0"s constituting the reference index (32) contained in the digital data to be transmitted or recorded and a rule that the predetermined pattern of "1"s and "0"s of the modulated digital data shall not contain the predetermined pattern of "1"s and "0"s constituting the reference indexes (124) contained in the digital data to be transmitted or recorded.

With this arrangement, a less rigorous limit can be imposed on the number of selectable modulation codes and modulation codes can be extracted more reliably at the time of reception or reproduction to reduce the number of errors that can be appear at the time of reading modulation codes if compared with the use of modulation codes adapted to remove DC components because the modulation rule provides only discrimination of modulation codes and reference indexes (markers).

(19) The digital data modulator according to one of (15), (16) and (17), if the digital data to be transmitted or recorded comprises a section (28, 30) to be modulated and a section (34) not to be modulated that are located adjacent to each other, the predetermined rule includes one of a rule that the number of consecutive bits of at least one of "1"s and "0"s of the modulated digital data shall be less than the largest number of consecutive bits of the at least one of "1"s and "0"s constituting the reference index (32) contained in the digital data to be transmitted or recorded in a region where the section to be modulated adjoins the section not to be modulated and a rule that the predetermined pattern of "1"s and "0"s of the modulated digital data shall not contain the predetermined pattern of "1"s and "0"s constituting the reference indexes (124) contained in the digital data to be transmitted or recorded in a region where the section to be modulated adjoins the section not to be modulated.

With this arrangement, a less rigorous limit can be imposed on the number of selectable modulation codes and modulation codes can be extracted more reliably at the time of reception or reproduction to reduce the number of errors that can be appear at the time of reading modulation codes if compared with the use of modulation codes adapted to remove DC components because the modulation rule provides only discrimination of modulation codes and reference indexes (markers), taking into consideration the section not to be modulated that is located adjacent to the section to be modulated into consideration.

(20) The digital data modulator according to one of (15), (16), (17), (18) and (19), characterized in that the N-bit data is a data that corresponds to a 1-byte data at the time of byte error correction coding to be conducted prior to the modulation.

With this arrangement, a byte of a byte error correction code is made to correspond to a modulation code without increasing the number of byte errors for wrong corrections that can take place in a demodulation error correcting operation at the time of reception or reproduction (error correcting operation on modulation codes). Thus, the byte error rate can reliably be reduced in the demodulation error correcting operation to effectively carry out a byte error correcting operation after demodulation. m (21) A digital data demodulator for demodulating an M+K-bit digital data obtained by a digital data modulating method of converting N-bit data into an M+K-bit data selected out of a group of $2^M$ M+K-bit data according to a predetermined rule, the group of $2^M$ M+K-bit data being obtained by adding a K-bit error correction checking symbol to M-bit data (N<M), back into N-bit data, characterized by comprising:

an error correcting section (52; 74) carrying out at least one of an error correcting operation and an error detecting operation on the M+K-bit data (64); and a demodulating section (54; 76) for demodulating the M+K-bit data (66) subjected to the at least one of the error correcting operation and the error detecting operation into N-bit data (72).

With this arrangement, demodulation errors can be reduced or detected by carrying out an error correcting operation or an error detecting operation on the modulation code to which an error correction checking symbol is added. The detected demodulation errors can be utilized as deletion flags for the error correcting operation to be conducted after modulation to carry out the deleting and correcting operation so that the demodulation errors are reduced or detected to maximize the error correcting capability for correcting errors after demodulation.

(22) The digital data demodulator according to (21), characterized in that the demodulating section extracts only the M-bit data (68) from the M+K-bit data (66) that has been subjected to the at least one of the error correcting operation and the error detecting operation by removing the K-bit error correction checking symbol and demodulate the extracted M-bit data (68) into an N-bit data (72).

With this arrangement, demodulation errors can be reduced or detected by carrying out an error correcting operation or an error detecting operation on the modulation codes to which an error correction checking symbol is added. Additionally, a small demodulation can be used because the error correction checking symbol is removed from the modulation code that has been subjected to an error correcting operation or an error detecting operation before demodulation. The detected demodulation errors can be utilized as deletion flags for the error correcting operation to be conducted after modulation to carry out the deleting and correcting operation so that the demodulation errors are reduced or detected to maximize the error correcting capability for correcting errors after demodulation.

(23) A digital data demodulator for demodulating an M+K-bit digital data obtained by a digital data modulating method of converting the input N-bit into an N+K-bit data selected out of a group of L×$2^M$ M+K-bit data according to a predetermined rule, the group of L×$2^M$ M+K-bit data being obtained by adding K-bit error correction checking symbols generated on the basis of L error correcting generation polynomials to M-bit data (N<M) on a one by one basis and in terms of Hamming distance greater than a predetermined value, into an N-bit data, characterized by comprising:

an error correcting section ($74_1$, $74_2$) for carrying out one of an error correcting operation and an error detecting operation on the M+K-bit data corresponding to each of the L error correction generation polynomials;

a demodulating section ($76_1$, $76_2$) for demodulating the L M+K-bit data subjected to the one of the error correcting operation and the error detecting operation into L N-bit data; and an output section ($76_3$) for selecting the most likely N-bit data out of the demodulated L N-bit data and outputting it with the demodulation error identifying information corresponding to the selected N-bit data.

With this arrangement, demodulation errors can be reduced or detected by carrying out an error correcting operation or an error detecting operation on the modulation code to which an error correction checking symbol is added. The detected demodulation errors can be utilized as deletion flags for the error correcting operation to be conducted after modulation to carry out the deleting and correcting operation so that the demodulation errors are reduced or detected to maximize the error correcting capability for correcting errors after demodulation.

(24) The digital data demodulator according to (23), characterized in that the demodulating section extracts only the L M-bit data from the L M+K-bit data that has been subjected to the one of the error correcting operation and the error detecting operation by removing the respective K-bit error correction checking symbols and demodulates the extracted L M-bit data into L N-bit data.

With this arrangement, demodulation errors can be reduced or detected by carrying out an error correcting operation or an error detecting operation on the modulation codes to which an error correction checking symbol is added. Additionally, a small demodulation can be used because the error correction checking symbol is removed from the modulation code that has been subjected to an error correcting operation or an error detecting operation before demodulation. The detected demodulation errors can be utilized as deletion flags for the error correcting operation to be conducted after modulation to carry out the deleting and correcting operation so that the demodulation errors are reduced or detected to maximize the error correcting capability for correcting errors after demodulation.

(25) A digital data demodulator for demodulating an $M_i+K_i$-bit digital data obtained by a digital data modulating method of converting by means of a converting method selected out of R different converting methods the input N-bit into an $M_i+K_i$-bit data selected out of a group of $2^{Mi}$ $M_i+K_i$-bit data according to a predetermined rule, the group of $2^{Mi}$ $M_i+K_i$-bit data being obtained by adding $K_i$-bit error correction checking symbols ($K_i$ being 0 or a positive integer) to $M_i$-bit data (N<M; i=0, 1, 2, 3, . . . , R−1) on a one by one basis, the digital data modulating method including a step of outputting the obtained $M_i+K_i$-bit digital data along with information data showing the selected converting method, into an N-bit data, characterized by comprising:

an information data extracting section (112) for extracting the information data showing the selected converting method;

a bit data extracting section (114) for extracting the $M_i+K_i$-bit data according to the extracted information data; and a demodulating section (116, 118, 120, 122) for demodulating the extracted $M_i+K_i$-bit data into an N-bit data according to the extracted information data.

With this arrangement, the information describing the type of the modulation code selected according to the characteristics of the transmission or recording medium is extracted prior to demodulation so that the type of modulation code can be determined without requiring a complicated process and hence the modulation code can be extracted and demodulated reliably according to the type of the modulation code.

(26) The digital data demodulator according to (25), characterized in that the demodulating section (116, 118, 120, 122) for demodulating the extracted $M_i+K_i$-bit data into an N-bit data comprises:

an error correcting section (120) for conducting one of an error correcting operation and an error detecting operation on the $M_i+K_i$-bit data when the $K_i$ determined unequivocally from the extracted information data is not equal to 0; and a data demodulating section (118, 122) for demodulating the $M_i+K_i$-bit data that has been subjected to the one of the error correcting operation and the error detecting operation into an N-bit data.

With this arrangement, demodulation errors can be reduced and detected by carrying out an error correcting operation or an error detecting operation on the modulation codes of a plurality of different types to which an error correction checking symbol is added. The detected demodulation errors can be utilized as deletion flags for the error correcting operation to be conducted after modulation to carry out the deleting and correcting operation so that the demodulation errors are reduced or detected to maximize the error correcting capability for correcting errors after demodulation.

(27) The digital data demodulator according to (25), characterized in that the demodulating section (116, 118, 120, 122) for demodulating the extracted $M_i+K_i$-bit data into an N-bit data comprises:

an error correcting section (120) for conducting one of an error correcting operation and an error detecting operation on the extracted $M_i+K_i$-bit data when the $K_i$ determined unequivocally from the extracted information data is not equal to 0;

a removing section (118, 122) for extracting only the $M_i$-bit data from the $M_i+K_i$-bit data that has been subjected to the one of the error correcting operation and the error detecting operation by removing the $K_i$-bit error correcting checking symbol; and an extracted data demodulating section (118, 122) for demodulating the $M_i$-bit data extracted by the removing section into an N-bit data.

With this arrangement, demodulation errors can be reduced or detected by carrying out an error correcting operation or an error detecting operation on the modulation codes of a plurality of different types to which an error correction checking symbol is added. Additionally, a small demodulation can be used because the error correction checking symbol is removed from the modulation code that has been subjected to an error correcting operation or an error detecting operation before demodulation. The detected demodulation errors can be utilized as deletion flags for the error correcting operation to be conducted after modulation to carry out the deleting and correcting operation so that the demodulation errors are reduced or detected to maximize the error correcting capability for correcting errors after demodulation.

(28) The digital data demodulator according to one of (21), (22), (23), (24), (25), (26) and (27), characterized in that the N-bit data is a data that corresponds to a 1-byte data at the time of byte error correction decoding to be conducted subsequent to the demodulation.

With this arrangement, a byte of a byte error correction code is made to correspond to a modulation code without increasing the number of byte errors for wrong corrections that can take place in a demodulation error correcting operation at the side of the receiving or reproducing apparatus. Thus, the byte error rate can reliably be reduced in the demodulation error correcting operation to effectively carry out a byte error correcting operation after demodulation.

(29) A method of modulating digital data to be used for printing and recording an N-bit data on a predetermined medium as optically readable code pattern, characterized in that the code pattern (26) is formed by arranging a plurality of blocks (36) having a predetermined area adapted to hold a predetermined volume of data, the block at least comprising: a pattern (30) formed by a plurality of dot images arranged in correspondence with the held data; a marker (32; 124) arranged with a predetermined positional relationship with the dot image pattern to determine a reference position for reading the dot image pattern; and a block address pattern (28) for indicating the positions of the blocks of the code pattern and, when an N-bit data is converted into an M-bit data selected out of a group of $2^M$ M-bit data (N<M) according to a predetermined rule and data values of the M-bit data are caused to correspond to respective dot images of predetermined colors, the total number of dot images contained in each of the blocks is made equal to a value obtained by multiplying the M by an integer.

With this arrangement, in an operation of recording a modulation code as a code pattern of blocks, the number of recordable dot images of each block is made equal to a value obtained by multiplying the number of modulation code bits by an integer in order to prevent the modulation code from being recorded over two blocks so that it can be read out randomly on a block by block basis. Thus, the operation of manually scanning and reading a code pattern can be carried out with less restrictions.

(30) The method of modulating digital data according to (29), characterized in that the total number of dot images contained at least one of the blocks is made equal to a value obtained by multiplying the M by an integer by making the block contain a number of dot images of dummy data.

With this arrangement, in an operation of recording a modulation code as a code pattern of blocks, the number of recordable dot images of each block is made equal to a value obtained by multiplying the number of modulation code bits by an integer by adding dummy data in order to prevent the modulation code from being recorded over two blocks so that it can be read out randomly on a block by block basis. Thus, the operation of manually scanning and reading a code pattern can be carried out with less restrictions.

Additional advantages and modifications will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents.

I claim:

1. A method of modulating digital data to be used for transmitting or recording N-bit data, comprising steps of:

inputting an N-bit data;

converting the input N-bit data into an M+K-bit data selected out of a group of $2^M$ M+K-bit data according to a predetermined rule, the group of $2^M$ M+K-bit data being obtained by adding a K-bit error correction checking symbol to M-bit data (N<M); and outputting the converted M+K-bit data.

2. The method of modulating digital data according to claim 1, wherein the predetermined rule includes one of: (i) a rule that a number of consecutive bits of at least one of "1"s and "0"s of the modulated digital data shall be less than a largest number of consecutive bits of the at least one of "1"s and "0"s constituting a reference index contained in the digital data to be transmitted or recorded, and (ii) a rule that a predetermined pattern of "1"s and "0"s of the modulated digital data shall not contain a predetermined pattern of "1"s and "0"s constituting reference indexes contained in the digital data to be transmitted or recorded.

3. The method of modulating digital data according to claim 1, wherein, if the digital data to be transmitted or recorded comprises a section to be modulated and a section not to be modulated that are located adjacent to each other, the predetermined rule includes one of: (i) a rule that a number of consecutive bits of at least one of "1"s and "0"s of the modulated digital data shall be less than a largest number of consecutive bits of the at least one of "1"s and "0"s constituting a reference index contained in the digital data to be transmitted or recorded in a region where the section to be modulated adjoins the section not to be modulated and (ii) a rule that a predetermined pattern of "1"s and "0"s of the modulated digital data shall not contain a predetermined pattern of "1"s and "0"s constituting reference indexes contained in the digital data to be transmitted or recorded in the region where the section to be modulated adjoins the section not to be modulated.

4. The method of modulating digital data according to claim 1, wherein the N-bit data comprises data that corresponds to a 1-byte data at a time of byte error correction coding to be conducted prior to the modulation.

5. A method of modulating digital data to be used for transmitting or recording N-bit data, comprising steps of:

inputting an N-bit data;

converting the input N-bit data into an M+K-bit data selected out of a group of $L \times 2^M$ M+K-bit data according to a predetermined rule, the group of $L \times 2^M$ M+K-bit data being obtained by adding K-bit error correction checking symbols generated on the basis of L error correcting generation polynomials to M-bit data (N<M) on a one by one basis and in terms of Hamming distance greater than a predetermined value; and outputting the converted M+K-bit data.

6. The method of modulating digital data according to claim 5, wherein the predetermined rule includes one of: (i) a rule that a number of consecutive bits of at least one of "1"s and "0"s of the modulated digital data shall be less than a largest number of consecutive bits of the at least one of "1"s and "0"s constituting a reference index contained in the digital data to be transmitted or recorded, and (ii) a rule that a predetermined pattern of "1"s and "0"s of the modulated digital data shall not contain a predetermined pattern of "1"s and "0"s constituting reference indexes contained in the digital data to be transmitted or recorded.

7. The method of modulating digital data according to claim 5, wherein, if the digital data to be transmitted or recorded comprises a section to be modulated and a section not to be modulated that are located adjacent to each other, the predetermined rule includes one of: (i) a rule that a number of consecutive bits of at least one of "1"s and "0"s of the modulated digital data shall be less than a largest number of consecutive bits of the at least one of "1"s and "0"s constituting a reference index contained in the digital data to be transmitted or recorded in a region where the section to be modulated adjoins the section not to be modulated, and (ii) a rule that a predetermined pattern of "1"s and "0"s of the modulated digital data shall not contain a predetermined pattern of "1"s and "0"s constituting reference indexes contained in the digital data to be transmitted or recorded in the region where the section to be modulated adjoins the section not to be modulated.

8. The method of modulating digital data according to claim 5, wherein the N-bit data comprises data that corresponds to a 1-byte data at a time of byte error correction coding to be conducted prior to the modulation.

9. A method of modulating digital data to be used for transmitting or recording N-bit data, comprising steps of:

inputting an N-bit data;

converting by means of a converting method selected out of R different converting methods the input N-bit data into an $M_i+K_i$-bit data selected out of a group of $2^{Mi}$ $M_i+K_i$-bit data according to a predetermined rule, the group of $2^{Mi}$ $M_i+K_i$-bit data being obtained by adding $K_i$-bit error correction checking symbols ($K_i$ being 0 or a positive integer) to $M_i$-bit data (N<$M_i$; i=0, 1, 2, 3, . . . , R−1) on a one by one basis; and outputting the converted $M_i+K_i$-bit data along with information data showing the selected converting method.

10. The method of modulating digital data according to claim 9, wherein the predetermined rule includes one of: (i) a rule that a number of consecutive bits of at least one of "1"s and "0"s of the modulated digital data shall be less than a largest number of consecutive bits of the at least one of "1"s and "0"s constituting a reference index contained in the digital data to be transmitted or recorded, and (ii) a rule that a predetermined pattern of "1"s and "0"s of the modulated digital data shall not contain a predetermined pattern of "1"s and "0"s constituting reference indexes contained in the digital data to be transmitted or recorded.

11. The method of modulating digital data according to claim 9, wherein, if the digital data to be transmitted or recorded comprises a section to be modulated and a section not to be modulated that are located adjacent to each other, the predetermined rule includes one of: (i) a rule that a number of consecutive bits of at least one of "1"s and "0"s of the modulated digital data shall be less than a largest number of consecutive bits of the at least one of "1"s and "0"s constituting a reference index contained in the digital data to be transmitted or recorded in a region where the section to be modulated adjoins the section not to be modulated, and (ii) a rule that a predetermined pattern of "1"s and "1"s of the modulated digital data shall not contain a predetermined pattern of "1"s and "0"s constituting reference indexes contained in the digital data to be transmitted or recorded in the region where the section to be modulated adjoins the section not to be modulated.

12. The method of modulating digital data according to claim 9, wherein the N-bit data comprises data that corresponds to a 1-byte data at a time of byte error correction coding to be conducted prior to the modulation.

13. A method of demodulating an M+K-bit digital data into an N-bit data, where the M+K-bit digital data has been obtained by a digital data modulating method of converting the N-bit data into an M+K-bit data selected out of a group of $2^M$ M+K-bit data according to a predetermined rule, the group of $2^M$ M+K-bit data being obtained by adding a K-bit error correction checking symbol to M-bit data (N<M), said method of demodulating comprising steps of:

carrying out at least one of an error correcting operation and an error detecting operation on the M+K-bit data; and demodulating the M+K-bit data subjected to the at least one of the error correcting operation and the error detecting operation into the N-bit data.

14. The method of demodulating digital data according to claim 13, wherein the step of demodulating includes steps of:

extracting only the M-bit data from the M+K-bit data that has been subjected to the at least one of the error correcting operation and the error detecting operation by removing the K-bit error correction checking symbol; and demodulating the extracted M-bit data into the N-bit data.

15. The method of demodulating digital data according to claim 14, wherein the N-bit data comprises data that corresponds to a 1-byte data at a time of byte error correction decoding to be conducted subsequent to the demodulation.

16. A method of demodulating an M+K-bit digital data into an N-bit data, where the M+K-bit digital data has been obtained by a digital data modulating method of converting the N-bit into an M+K-bit data selected out of a group of $L \times 2^M$ M+K-bit data according to a predetermined rule, the group of $L \times 2^M$ M+K-bit data being obtained by adding K-bit error correction checking symbols generated on the basis of L error correcting generation polynomials to 14-bit data (N<M) on a one by one basis and in terms of Hamming distance greater than a predetermined value, said method of demodulating comprising steps of:

carrying out one of an error correcting operation and an error detecting operation on the M+K-bit data corresponding to each of the L error correction generation polynomials;

demodulating the L M+K-bit data subjected to the one of the error correcting operation and the error detecting operation into L N-bit data; and selecting a most likely N-bit data out of the demodulated L N-bit data and outputting the selected N-bit data with corresponding demodulation error identifying information.

17. The method of demodulating digital data according to claim 16, wherein the step of demodulating includes steps of:

extracting only the L M-bit data from the L M+K-bit data that has been subjected to the one of the error correcting operation and the error detecting operation by removing the respective K-bit error correction checking symbols; and demodulating the extracted L M-bit data into L N-bit data.

18. The method of demodulating digital data according to claim 16, wherein the N-bit data comprises data that corresponds to a 1-byte data at a time of byte error correction decoding to be conducted subsequent to the demodulation.

19. A method of demodulating an $M_i+K_i$-bit digital data into an N-bit data, where the $M_i+K_i$-bit digital data has been obtained by a digital data modulating method of converting by means of a converting method selected out of R different converting methods the input N-bit into an $M_i+K_i$-bit data selected out of a group of $2^{Mi}$ $M_i+K_i$-bit data according to a predetermined rule, the group of $2^{Mi}$ $M_{+Ki}$-bit data being obtained by adding $K_i$-bit error correction checking symbols ($K_i$ being 0 or a positive integer) to $M_i$-bit data (N<$M_i$; i=0, 1, 2, 3, . . . , R−1) on a one by one basis, and where the digital data modulating method included a step of outputting the obtained $M_i+K_i$-bit digital data along with information data showing the selected converting method, said method of demodulating comprising steps of:

extracting the information data showing the selected converting method;

extracting the $M_i+K_i$-bit data according to the extracted information data; and demodulating the extracted $M_i+K_i$-bit data into the N-bit data according to the extracted information data.

20. The method of demodulating digital data according to claim 19, further comprising a step of conducting one of an error correcting operation and an error detecting operation on the extracted $M_i+K_i$-bit data when a value of $K_i$ determined unequivocally from the extracted information data is not equal to 0, and wherein said step of demodulating includes a step of demodulating the $M_i+K_i$-bit data that has been subjected to the one of the error correcting operation and the error detecting operation into the N-bit data.

21. The method of demodulating digital data according to claim 19, further comprising a step of conducting one of an error correcting operation and an error detecting operation on the extracted $M_i+K_i$-bit data when a value of $K_i$ determined unequivocally from the extracted information data is not equal to 0, and wherein said step of demodulating includes steps of:
extracting only the $M_i$-bit data from the $M_i+K_i$-bit data that has been subjected to the one of the error correcting operation and the error detecting operation by removing the $K_i$-bit error correcting checking symbol; and
demodulating the extracted $M_i$-bit data into the N-bit data.

22. The method of demodulating digital data according to claim 19, wherein the N-bit data comprises data that corresponds to a 1-byte data at a time of byte error correction decoding to be conducted subsequent to the demodulation.

23. A digital data modulator to be used for transmitting or recording N-bit data, comprising:
an input terminal for inputting an N-bit data;
a converting section for converting the input N-bit data into an M+K-bit data selected out of a group of $2^M$ M+K-bit data according to a predetermined rule, the group of $2^M$ M+K-bit data being obtained by adding a K-bit error correction checking symbol to M-bit data (N<M); and
an output terminal for outputting the converted M+K-bit data.

24. The digital data modulator according to claim 23, wherein the predetermined rule includes one of: (i) a rule that a number of consecutive bits of at least one of "1"s and "0"s of the modulated digital data shall be less than a largest number of consecutive bits of the at least one of "1"s and "0"s constituting a reference index contained in the digital data to be transmitted or recorded, and (ii) a rule that a predetermined pattern of "1"s and "0"s of the modulated digital data shall not contain a predetermined pattern of "1"s and "0"s constituting reference indexes contained in the digital data to be transmitted or recorded.

25. The digital data modulator according to claim 23, wherein, if the digital data to be transmitted or recorded comprises a section to be modulated and a section not to be modulated that are located adjacent to each other, the predetermined rule includes one of:(i) a rule that a number of consecutive bits of at least one of "1"s and "0"s of the modulated digital data shall be less than a largest number of consecutive bits of the at least one of "1"s and "0"s constituting a reference index contained in the digital data to be transmitted or recorded in a region where the section to be modulated adjoins the section not to be modulated, and (ii) a rule that a predetermined pattern of "1"s and "0"s of the modulated digital data shall not contain a predetermined pattern of "1"s and "0"s constituting reference indexes contained in the digital data to be transmitted or recorded in the region where the section to be modulated adjoins the section not to be modulated.

26. The digital data modulator according to claim 23, wherein the N-bit data comprises data that corresponds to a 1-byte data at a time of byte error correction coding to be conducted prior to the modulation.

27. A digital data modulator to be used for transmitting or recording N-bit data, comprising:
an input terminal for inputting an N-bit data;
a converting section for converting the input N-bit data into an M+K-bit data selected out of a group of $L \times 2^M$ M+K-bit data according to a predetermined rule, the group of $L \times 2^M$ M+K-bit data being obtained by adding K-bit error correction checking symbols generated on the basis of L error correcting generation polynomials to M-bit data (N<M) on a one by one basis and in terms of Hamming distance greater than a predetermined value; and
an output terminal for outputting the converted M+K-bit data.

28. The digital data modulator according to claim 27, wherein the predetermined rule includes one of: (i) a rule that a number of consecutive bits of at least one of "1"s and "0"s of the modulated digital data shall be less than a largest number of consecutive bits of the at least one of "1"s and "0"s constituting a reference index contained in the digital data to be transmitted or recorded, and (ii a rule that a predetermined pattern of "1"s and "0"s of the modulated digital data shall not contain a predetermined pattern of "1"s and "0"s constituting reference indexes contained in the digital data to be transmitted or recorded.

29. The digital data modulator according to claim 27, wherein, if the digital data to be transmitted or recorded comprises a section to be modulated and a section not to be modulated that are located adjacent to each other, the predetermined rule includes one of: (i) a rule that a number of consecutive bits of at least one of "1"s and "0"s of the modulated digital data shall be less than a largest number of consecutive bits of the at least one of "1"s and "0"s constituting a reference index contained in the digital data to be transmitted or recorded in a region where the section to be modulated adjoins the section not to be modulated, and (ii) a rule that a predetermined pattern of "1"s and "0"s of the modulated digital data shall not contain a predetermined pattern of "1"s and "0"s constituting reference indexes contained in the digital data to be transmitted or recorded in the region where the section to be modulated adjoins the section not to be modulated.

30. The digital data modulator according to claim 27, wherein the N-bit data comprises data that corresponds to a 1-byte data at a time of byte error correction coding to be conducted prior to the modulation.

31. A digital data modulator to be used for transmitting or recording N-bit data, comprising:
an input terminal for inputting an N-bit data;
a converting section for converting by means of a converting method selected out of R different converting methods the input N-bit data into an $M_i+K_i$-bit data selected out of a group of $2^{Mi}$ $M_i+K_i$-bit data according to a predetermined rule, the group of $2^{Mi}$ $M_i+K_i$-bit data being obtained by adding $K_i$-bit error correction checking symbols ($K_i$=0, 1, 2, 3, . . . ) to $M_i$-bit data (N<$M_i$; i=0, 1, 2, 3, . . . , R−1) on a one by one basis; and
an output terminal for outputting the converted $M_i+K_i$-bit data along with information data showing the selected converting method.

32. The digital data modulator according to claim 31, wherein the predetermined rule includes one of: (i) a rule that a number of consecutive bits of at least one of "1"s and "0"s of the modulated digital data shall be less than a largest number of consecutive bits of the at least one of "1"s and "0"s constituting a reference index contained in the digital data to be transmitted or recorded, and (ii) a rule that a predetermined pattern of "1"s and "0"s of the modulated digital data shall not contain a predetermined pattern of "1"s and "0"s constituting reference indexes contained in the digital data to be transmitted or recorded.

33. The digital data modulator according to claim 31, wherein, if the digital data to be transmitted or recorded comprises a section to be modulated and a section not to be modulated that are located adjacent to each other, the predetermined rule includes one of: (i) a rule that a number of consecutive bits of at least one of "1"s and "0"s of the modulated digital data shall be less than a largest number of consecutive bits of the at least one of "1"s and "0"s constituting a reference index contained in the digital data to be transmitted or recorded in a region where the section to be modulated adjoins the section not to be modulated, and (ii) a rule that a predetermined pattern of "1"s and "0l"s of the modulated digital data shall not contain a predetermined pattern of "1"s and "0"s constituting reference indexes contained in the digital data to be transmitted or recorded in the region where the section to be modulated adjoins the section not to be modulated.

34. The digital data modulator according to claim 31, wherein the N-bit data comprises data that corresponds to a 1-byte data at a time of byte error correction coding to be conducted prior to the modulation.

35. A digital data demodulator for demodulating an M+K-bit digital data into an N-bit data, where the M+K-bit digital data has been obtained by a digital data modulating method of converting N-bit data into an M+K-bit data selected out of a group of $2^M$ M+K-bit data according to a predetermined rule, the group of $2^M$ M+K-bit data being obtained by adding a K-bit error correction checking symbol to M-bit data (N<M), said demodulator comprising:

an error correcting section carrying out at least one of an error correcting operation and an error detecting operation on the M+K-bit data; and a demodulating section for demodulating the M+K-bit data subjected to the at least one of the error correcting operation and the error detecting operation into the N-bit data.

36. The digital data demodulator according to claim 35, wherein said demodulating section extracts only the M-bit data from the M+K-bit data that has been subjected to the at least one of the error correcting operation and the error detecting operation by removing the K-bit error correction checking symbol, and demodulates the extracted M-bit data into the N-bit data.

37. The digital data demodulator according to claim 35, wherein the N-bit data comprises data that corresponds to a 1-byte data at a time of byte error correction decoding to be conducted subsequent to the demodulation.

38. A digital data demodulator for demodulating an M+K-bit digital data into an N-bit data, where the M+K digital data has been obtained by a digital data modulating method of converting the N-bit into an M+K-bit data selected out of a group of L×$2^M$ M+K-bit data according to a predetermined rule, the group of L×$2^M$ M+K-bit data being obtained by adding K-bit error correction checking symbols generated on the basis of L error correcting generation polynomials to M-bit data (N<M) on a one by one basis and in terms of Hamming distance greater than a predetermined value, said demodulator comprising:

an error correcting section for carrying out one of an error correcting operation and an error detecting operation on the M+K-bit data corresponding to each of the L error correction generation polynomials;

a demodulating section for demodulating the L M+K-bit data subjected to the one of the error correcting operation and the error detecting operation into L N-bit data; and an output section for selecting a most likely N-bit data out of the demodulated L N-bit data and outputting the selected N-bit data with corresponding demodulation error identifying information.

39. The digital data demodulator according to claim 38, wherein said demodulating section extracts only the L M-bit data from the L M+K-bit data that has been subjected to the one of the error correcting operation and the error detecting operation by removing the respective K-bit error correction checking symbols, and demodulates the extracted L M-bit data into L N-bit data.

40. The digital data demodulator according to claim 38, wherein the N-bit data comprises data that corresponds to a 1-byte data at a time of byte error correction decoding to be conducted subsequent to the demodulation.

41. A digital data demodulator for demodulating an $M_i+K_i$-bit digital data into an N-bit data, where the $M_i+K_i$-bit digital data has been obtained by a digital data modulating method of converting by means of a converting method selected out of R different converting methods the input N-bit into an $M_i+K_i$-bit data selected out of a group of $2^{Mi}$ $M_i+K_i$-bit data according to a predetermined rule, the group of $2^{Mi}$ $M_i+K_i$-bit data being obtained by adding $K_i$-bit error correction checking symbols ($K_i$ being 0 or a positive integer) to $M_i$-bit data (N<$M_i$; i=0, 1, 2, 3, . . . , R−1) on a one by one basis, and where the digital data modulating method including a step of outputting the obtained $M_i+K_i$-bit digital data along with information data showing the selected converting method, said demodulator comprising:

an information data extracting section for extracting the information data showing the selected converting method;

a bit data extracting section for extracting the $M_i+K_i$-bit data according to the extracted information data; and a demodulating section for demodulating the extracted $M_i+K_i$-bit data into the N-bit data according to the extracted information data.

42. The digital data demodulator according to claim 41, wherein said demodulating section for demodulating the extracted $M_i+K_i$-bit data into an N-bit data comprises:

an error correcting section for conducting one of an error correcting operation and an error detecting operation on the $M_i+K_i$-bit data when a value of $K_i$ determined unequivocally from the extracted information data is not equal to 0; and a data demodulating section for demodulating the $M_i+K_i$-bit data that has been subjected to the one of the error correcting operation and the error detecting operation into the N-bit data.

43. The digital data demodulator according to claim 41, wherein said demodulating section for demodulating the extracted $M_i+K_i$-bit data into an N-bit data comprises:

an error correcting section for conducting one of an error correcting operation and an error detecting operation on the extracted $M_i+K_i$-bit data when a value of $K_i$ determined unequivocally from the extracted information data is not equal to 0;

a removing section for extracting only the $M_i$-bit data from the $M_i+K_i$-bit data that has been subjected to the one of the error correcting operation and the error detecting operation by removing the $K_i$-bit error correcting checking symbol; and an extracted data demodulating section for demodulating the $M_i$-bit data extracted by the removing section into the N-bit data.

44. The digital data demodulator according to claim 41, wherein the N-bit data comprises data that corresponds to a 1-byte data at a time of byte error correction decoding to be conducted subsequent to the demodulation.

45. A method of modulating digital data to be used for printing and recording an N-bit data on a predetermined medium as an optically readable code pattern, wherein the code pattern is formed by arranging a plurality of blocks having a predetermined area adapted to hold a predetermined volume of data, each block comprising: a pattern formed by a plurality of dot images arranged in correspondence with the held data; a marker arranged with a predetermined positional relationship with the dot image pattern to determine a reference position for reading the dot image pattern; and a block address pattern for indicating positions of the blocks of the code pattern; and when an N-bit data is converted into an M-bit data selected out of a group of $2^M$ M-bit data (N<M) according to a predetermined rule and data values of the M-bit data are caused to correspond to respective dot images of predetermined colors, a total number of dot images contained in each of the blocks is made equal to a value obtained by multiplying M by an integer.

46. The method of modulating digital data according to claim 45, wherein the total number of dot images contained in at least one of the blocks is made equal to a value obtained by multiplying M by an integer by making the block contain a number of dot images of dummy data.

* * * * *